(12) United States Patent
Rao

(10) Patent No.: US 7,514,328 B2
(45) Date of Patent: Apr. 7, 2009

(54) METHOD FOR MAKING A SEMICONDUCTOR DEVICE INCLUDING SHALLOW TRENCH ISOLATION (STI) REGIONS WITH A SUPERLATTICE THEREBETWEEN

(75) Inventor: Kalipatnam Vivek Rao, Grafton, MA (US)

(73) Assignee: MEARS Technologies, Inc., Waltham, MA (US)

( * ) Notice: Subject to any disclaimer, the term of this patent is extended or adjusted under 35 U.S.C. 154(b) by 131 days.

(21) Appl. No.: 11/425,209

(22) Filed: Jun. 20, 2006

(65) Prior Publication Data

US 2006/0270169 A1 Nov. 30, 2006

Related U.S. Application Data

(63) Continuation-in-part of application No. 10/992,422, filed on Nov. 18, 2004, now Pat. No. 7,071,119, which is a continuation of application No. 10/647,060, filed on Aug. 22, 2003, now Pat. No. 6,958,486, which is a continuation-in-part of application No. 10/603,696, filed on Jun. 26, 2003, now abandoned, and a continuation-in-part of application No. 10/603,621, filed on Jun. 26, 2003, now abandoned.

(60) Provisional application No. 60/692,101, filed on Jun. 20, 2005.

(51) Int. Cl.
 *H01L 21/336* (2006.01)

(52) U.S. Cl. .......................... 438/285; 438/197; 257/28

(58) Field of Classification Search ................. 438/285, 438/197, 697, 424; 257/499
See application file for complete search history.

(56) References Cited

U.S. PATENT DOCUMENTS

| 4,406,710 A | * | 9/1983 | Davies et al. | ............... 438/232 |
| 4,485,128 A | | 11/1984 | Dalal et al. | .................. 427/85 |

(Continued)

FOREIGN PATENT DOCUMENTS

EP 0 843 361 5/1998

(Continued)

OTHER PUBLICATIONS

Luo et al., *Chemical Design of Direct-Gap Light-Emitting Silicon*, published Jul. 25, 2002, The American Physical Society; vol. 89, No. 7.

(Continued)

*Primary Examiner*—Steven Loke
*Assistant Examiner*—David Goodwin
(74) *Attorney, Agent, or Firm*—Allen, Dyer, Doppelt, Milbrath & Gilchrist, P.A.

(57) ABSTRACT

A method for making a semiconductor device may include forming a plurality of shallow trench isolation (STI) regions in a semiconductor substrate. Further, a plurality of layers may be deposited over the substrate to define respective superlattices over the substrate between adjacent STI regions and to define respective non-monocrystalline regions over the STI regions. The method may further include selectively removing at least portions of the non-monocrystalline regions using at least one active area (AA) mask.

20 Claims, 22 Drawing Sheets

U.S. PATENT DOCUMENTS

| | | | |
|---|---|---|---|
| 4,594,603 A | 6/1986 | Holonyak, Jr. | 357/16 |
| 4,882,609 A | 11/1989 | Schubert et al. | 357/22 |
| 4,908,678 A | 3/1990 | Yamazaki | 357/4 |
| 4,910,164 A * | 3/1990 | Shichijo | 438/492 |
| 4,937,204 A | 6/1990 | Ishibashi et al. | 437/110 |
| 4,969,031 A | 11/1990 | Kobayashi et al. | 357/63 |
| 5,055,887 A | 10/1991 | Yamazaki | 357/4 |
| 5,081,513 A | 1/1992 | Jackson et al. | 357/23.7 |
| 5,216,262 A | 6/1993 | Tsu | 257/17 |
| 5,357,119 A | 10/1994 | Wang et al. | 257/18 |
| 5,525,535 A * | 6/1996 | Hong | 438/228 |
| 5,577,061 A | 11/1996 | Hasenberg et al. | 372/45 |
| 5,594,567 A | 1/1997 | Akiyama et al. | 349/28 |
| 5,606,177 A | 2/1997 | Wallace et al. | 257/25 |
| 5,616,515 A | 4/1997 | Okuno | 438/478 |
| 5,627,386 A | 5/1997 | Harvey et al. | 257/79 |
| 5,651,858 A * | 7/1997 | Lin | 438/706 |
| 5,683,934 A | 11/1997 | Candelaria | 437/134 |
| 5,684,817 A | 11/1997 | Houdre et al. | 372/45 |
| 5,686,348 A * | 11/1997 | Chao | 438/449 |
| 5,736,415 A * | 4/1998 | Chang et al. | 438/217 |
| 5,837,612 A * | 11/1998 | Ajuria et al. | 438/697 |
| 5,994,164 A | 11/1999 | Fonash et al. | 438/97 |
| 6,058,127 A | 5/2000 | Joannopoulos et al. | 372/92 |
| 6,147,384 A | 11/2000 | Chen | 257/347 |
| 6,255,150 B1 | 7/2001 | Wilk et al. | 438/191 |
| 6,274,007 B1 | 8/2001 | Smirnov et al. | 204/192 |
| 6,281,518 B1 | 8/2001 | Sato | 257/13 |
| 6,281,532 B1 | 8/2001 | Doyle et al. | 257/288 |
| 6,326,311 B1 | 12/2001 | Ueda et al. | 438/694 |
| 6,344,271 B1 | 2/2002 | Yadav et al. | 428/402 |
| 6,350,993 B1 | 2/2002 | Chu et al. | 257/19 |
| 6,376,337 B1 | 4/2002 | Wang et al. | 438/478 |
| 6,436,784 B1 | 8/2002 | Allam | 438/380 |
| 6,472,685 B2 | 10/2002 | Takagi | 257/77 |
| 6,498,359 B2 | 12/2002 | Schmidt et al. | 257/190 |
| 6,501,092 B1 | 12/2002 | Nikonov et al. | 257/29 |
| 6,521,519 B2 | 2/2003 | Kamath et al. | 438/786 |
| 6,566,679 B2 | 5/2003 | Nikonov et al. | 257/29 |
| 6,608,327 B1 | 8/2003 | Davis et al. | 257/76 |
| 6,621,097 B2 | 9/2003 | Nikonov et al. | 257/17 |
| 6,638,838 B1 | 10/2003 | Eisenbeiser et al. | 438/481 |
| 6,646,293 B2 | 11/2003 | Emrick et al. | 257/194 |
| 6,673,646 B2 | 1/2004 | Droopad | 438/85 |
| 6,690,699 B2 | 2/2004 | Capasso et al. | 372/44 |
| 6,703,271 B2 * | 3/2004 | Yeo et al. | 438/221 |
| 6,711,191 B1 | 3/2004 | Kozaki et al. | 372/43 |
| 6,748,002 B2 | 6/2004 | Shveykin | 372/45 |
| 6,816,530 B2 | 11/2004 | Capasso et al. | 372/50 |
| 6,833,294 B1 * | 12/2004 | Mears et al. | 438/162 |
| 7,034,329 B2 * | 4/2006 | Mears et al. | 257/15 |
| 2002/0094003 A1 | 7/2002 | Bour et al. | 372/46 |
| 2003/0020103 A1 * | 1/2003 | Callaway et al. | 257/280 |
| 2003/0034529 A1 | 2/2003 | Fitzgerald et al. | 257/369 |
| 2003/0057416 A1 | 3/2003 | Currie et al. | 257/19 |
| 2003/0089899 A1 | 5/2003 | Lieber et al. | 257/9 |
| 2003/0162335 A1 | 8/2003 | Yuki et al. | 438/151 |
| 2003/0162348 A1 | 8/2003 | Yeo et al. | 438/218 |
| 2003/0215990 A1 | 11/2003 | Fitzgerald et al. | 438/172 |
| 2004/0016956 A1 * | 1/2004 | Choi et al. | 257/315 |
| 2004/0084781 A1 | 5/2004 | Ahn et al. | 257/777 |
| 2004/0126936 A1 * | 7/2004 | Sohn | 438/142 |
| 2004/0227165 A1 | 11/2004 | Wang et al. | 257/222 |
| 2004/0259314 A1 | 12/2004 | Balasubramanian et al. | 438/285 |
| 2005/0032327 A1 | 2/2005 | Ohnishi et al. | 438/424 |
| 2005/0167777 A1 | 8/2005 | Lee | 257/510 |

FOREIGN PATENT DOCUMENTS

| | | |
|---|---|---|
| EP | 1274134 | 1/2003 |
| GB | 2347520 | 9/2000 |
| JP | 61027681 | 2/1986 |
| JP | 61145820 | 7/1986 |
| JP | 61220339 | 9/1986 |
| JP | 62219665 | 9/1987 |
| TW | 497201 | 8/2002 |
| WO | 99/63580 | 12/1999 |
| WO | 02/103767 | 12/2002 |
| WO | 2005/013371 | 2/2005 |
| WO | WO2005/018005 | 2/2005 |

OTHER PUBLICATIONS

Tsu, *Phenomena in Silicon Nanostructure Devices*, University of North Carolina at Charlotte, Sep. 6, 2000.

Ye et al., *GaAs MOSFET with Oxide Gate Dielectric Grown by Atomic Layer Deposition*, Agere Systems, Mar. 2003.

Novikov et al., *Silicon-based Optoelectronics*, 1999-2003, pp. 1-6.

Fan et al., *N- and P-Type SiGe/Si Superlattice Coolers*, the Seventeenth Intersociety Conference on Thermomechanical Phenomena in Electronic Systems (ITherm 2000), vol. 1, pp. 304-307, Las Vegas, NV, May 2000.

Shah et al., *Experimental Analysis and Theoretical Model for Anomalously High Ideality Factors (n>2.0) in AlGaN/GaN P-N Junction Diodes*, Journal of Applied Physics, vol. 94, No. 4, Aug. 15, 2003.

Ball, *Striped Nanowires Shrink Electronics*, news@nature.com, Feb. 7, 2002.

Fiory et al., *Light Emission from Silicon: Some Perspectives and Applications*, Journal of Electronic Materials, vol. 32, No. 10, 2003.

*Lecture 6: Light Emitting and Detecting Devices*, MSE 6001, Semiconductor Materials Lectures, Fall 2004.

*Harvard University Professor and Nanosys Co-Founder, Charlie Lieber, Raises the Stakes in the Development of Nanoscale Superlattice Structures and Nanodevices*, Feb. 8, 2002, Nanosys, Inc.

\* cited by examiner

METHOD FOR MAKING A SEMICONDUCTOR DEVICE INCLUDING SHALLOW TRENCH ISOLATION (STI) REGIONS WITH A SUPERLATTICE THEREBETWEEN

CROSS-REFERENCE TO RELATED APPLICATIONS

This application claims the benefit of U.S. Provisional Application No. 60/692,101, filed Jun. 20, 2005, and is a continuation-in-part of U.S. patent application Ser. No. 10/992,422 filed Nov. 18, 2004, now U.S. Pat. No. 7,071,119 which is a continuation of U.S. patent application Ser. No. 10/647,060 filed Aug. 22, 2003, now U.S. Pat. No. 6,958,486, which is a continuation-in-part of U.S. patent application Ser. Nos. 10/603,696 and 10/603,621 filed on Jun. 26, 2003, now abandoned the entire disclosures of which are incorporated by reference herein.

FIELD OF THE INVENTION

The present invention relates to the field of semiconductors, and, more particularly, to semiconductors having enhanced properties based upon energy band engineering and associated methods.

BACKGROUND OF THE INVENTION

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an n-channel MOSFET is asserted to have a higher mobility.

U.S. Pat. No. 4,937,204 to Ishibashi et al. discloses a superlattice in which a plurality of layers, less than eight monolayers, and containing a fractional or binary or a binary compound semiconductor layer, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of $SiO_2$/Si with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen. The Si/O superlattice is disclosed as useful in a silicon quantum and light-emitting devices In particular, a green electromuminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

Published International Application WO 02/103,767 A1 to Wang, Tsu and Lofgren, discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc, can be tailored to yield new aperiodic materials with desirable band-structure characteristics. Other parameters, such as electrical conductivity, thermal conductivity and dielectric permittivity or magnetic permeability are disclosed as also possible to be designed into the material.

SUMMARY OF THE INVENTION

A method for making a semiconductor device may include forming a plurality of shallow trench isolation (STI) regions in a semiconductor substrate Further, a plurality of layers may be deposited over the substrate to define respective superlattices over the substrate between adjacent STI regions and to define respective non-monocrystalline regions over the STI regions. The method may further include selectively removing at least portions of the non-monocrystalline regions using at least one active area (AA) mask.

More particularly, the method may further include forming a plurality of NMOS and PMOS transistor channels associated with the superlattices so that the semiconductor device comprises a CMOS semiconductor device. Furthermore, selectively removing may include patterning a photoresist layer with the at least one AA mask to expose the non-monocrystalline regions, and performing at least one plasma etching of the exposed amorphous regions.

In addition, the at least one AA mask may be a single baseline AA mask. In other embodiments, the at least one AA mask may include a first oversized channel-stop AA mask for NMOS transistors, and a second oversized channel-stop AA mask for PMOS transistors. Accordingly, the method may further include performing a first channel-stop implant using the first oversized channel-stop AA mask, and performing a second channel-stop implant using the second oversized channel-stop AA mask. Moreover, a first etch may be performed prior to the first channel-stop implant, and a second etch performed prior to the second channel-stop implant. Also, non-monocrystalline stringers may be formed in divots in the STI regions, and at least a partial etch may be performed of the non-monocrystalline stringers.

Each superlattice may include a plurality of stacked groups of layers with each group comprising a plurality of stacked base semiconductor monolayers defining a base semiconductor portion and at least one non-semiconductor monolayer thereon. Moreover, the at least one non-semiconductor monolayer may be constrained within a crystal lattice of adjacent base semiconductor portions.

In some embodiments, the at least one non-semiconductor monolayer may be a single monolayer thick. Additionally, each base semiconductor portion may be less than eight monolayers thick. The superlattice may further include a base semiconductor cap layer on an uppermost group of layers. All of the base semiconductor portions may be a same number of monolayers thick in some embodiments, and in other embodiments at least some of the base semiconductor portions may be a different number of monolayers thick. Furthermore, all of the base semiconductor portions may be a different number of monolayers thick.

Each base semiconductor portion may include a base semiconductor selected from the group consisting of Group IV semiconductors, Group III-V semiconductors, and Group II-VI semiconductors, for example. Also by way of example, each non-semiconductor layer may include a non-semiconductor selected from the group consisting of oxygen, nitrogen, fluorine, and carbon-oxygen.

DETAILED DESCRIPTION OF THE PREFERRED EMBODIMENTS

Figure 1:
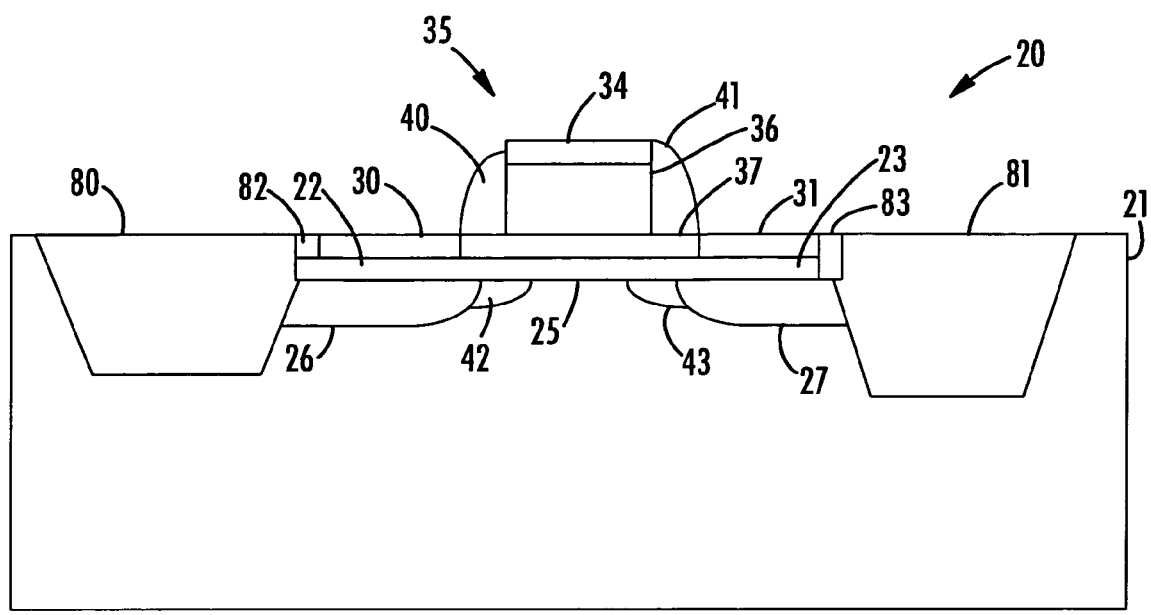
FIG. 1 is a cross-sectional view of a semiconductor device in accordance with the present invention including a superlattice.
Figure 2A:
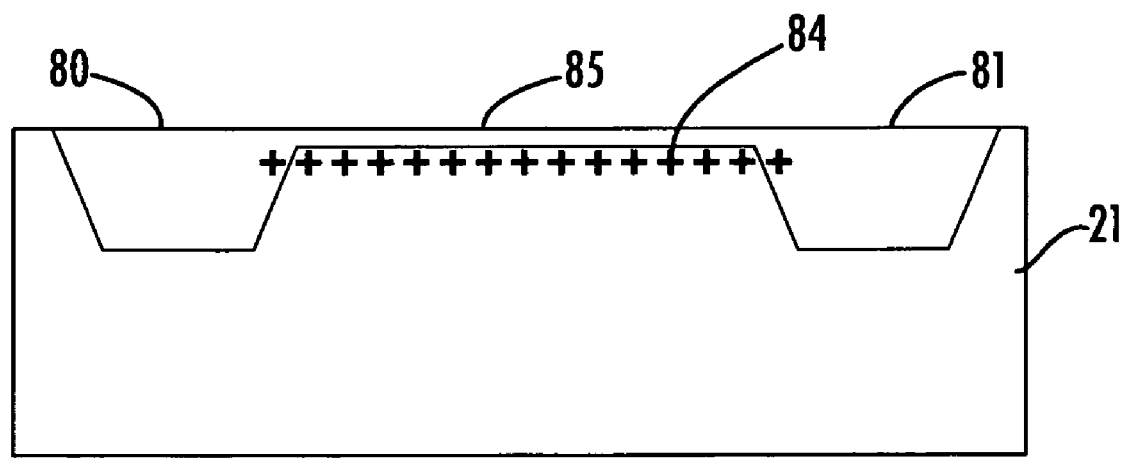
FIGS. 2A through 2D are cross-sectional views illustrating formation of the semiconductor device of FIG. 1 and potential difficulties associated therewith.
Figure 2B:
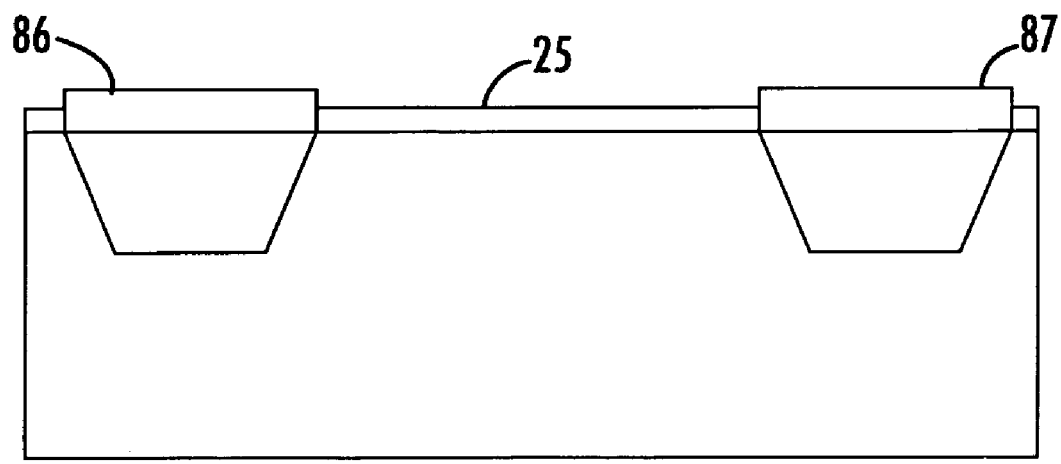
Figure 2C:
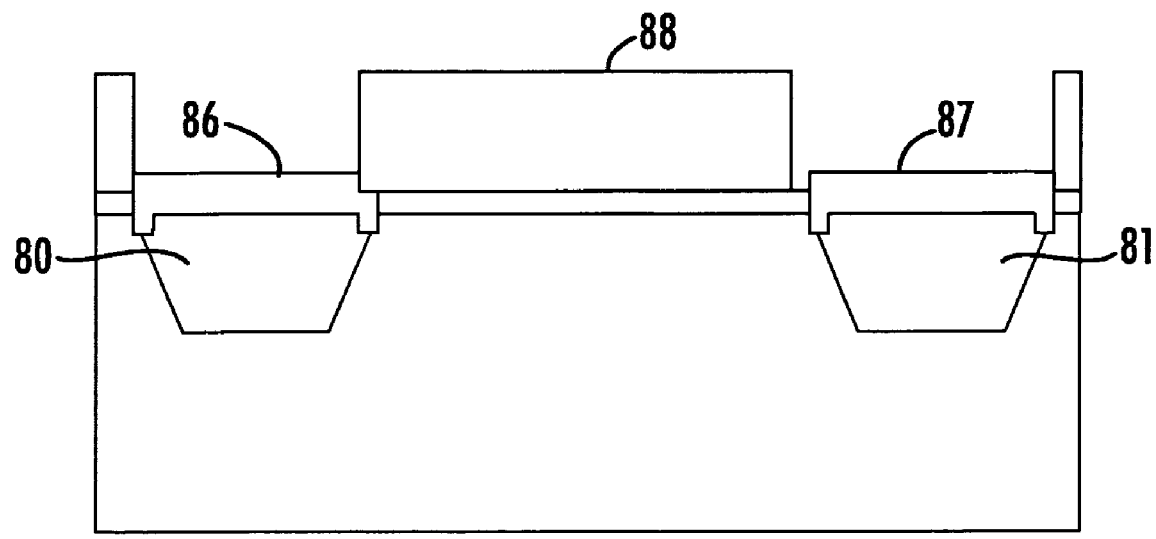
Figure 2D:
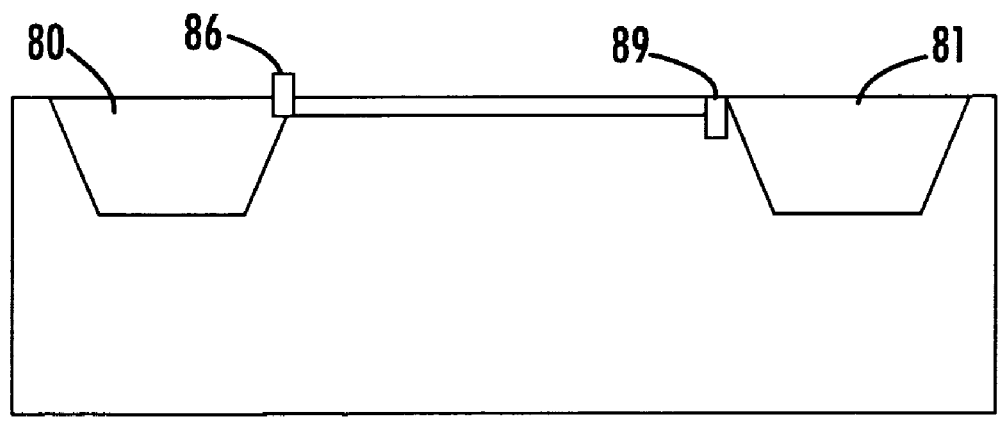
Figure 3:
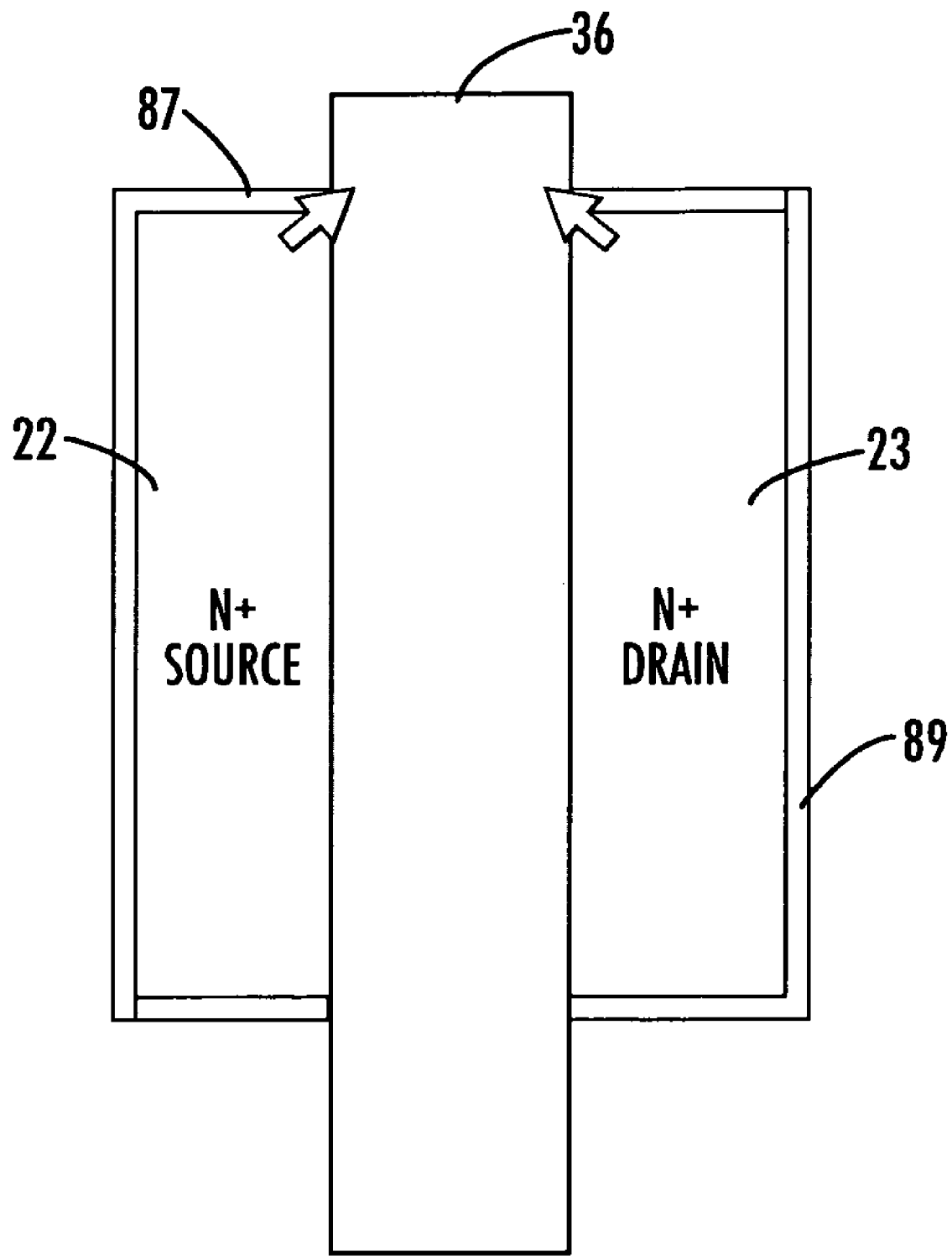
FIG. 3 is a top view of a portion of the semiconductor device of FIG. 1 after gate electrode pattern and etch.
Figure 4:
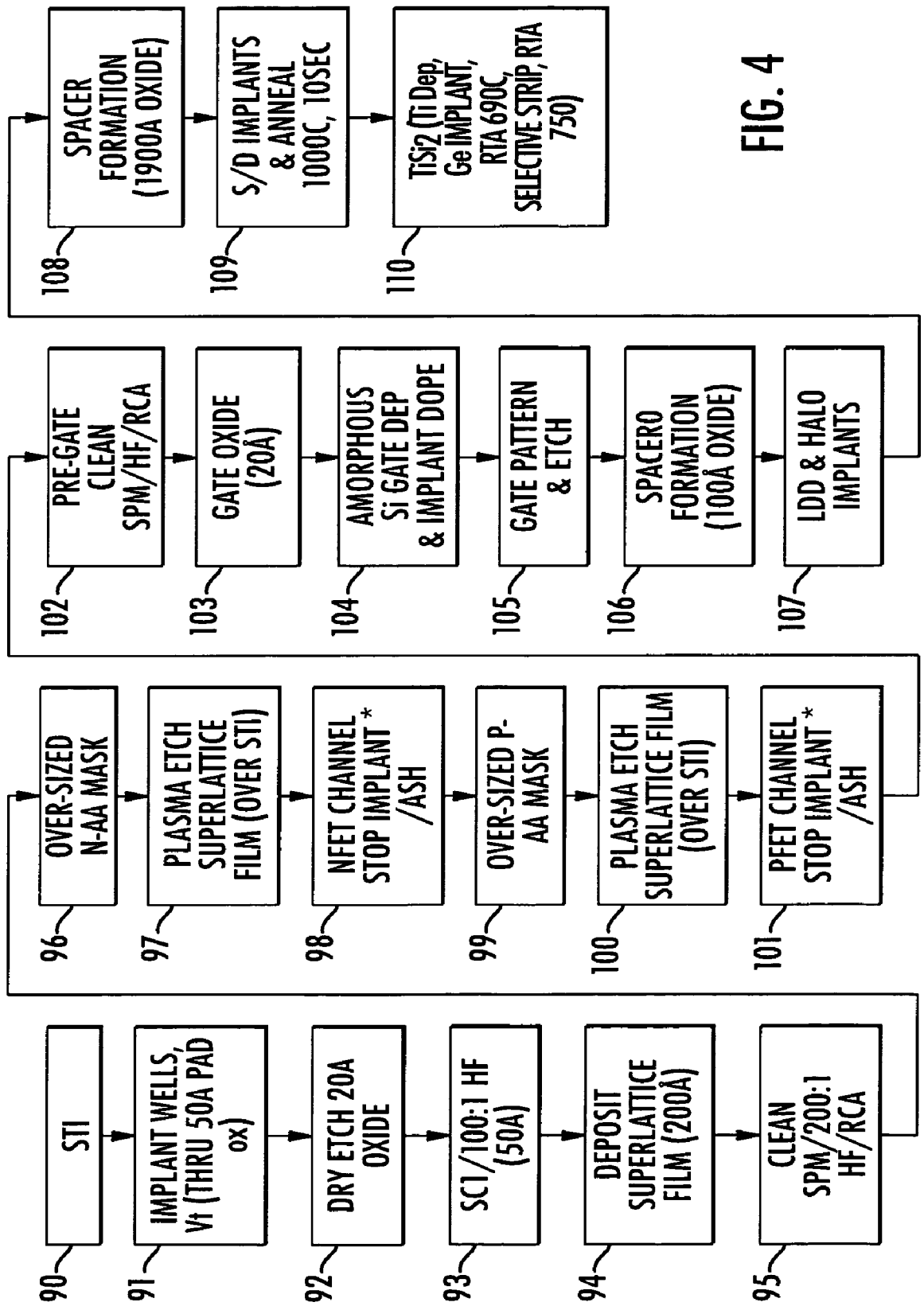
FIG. 4 is a flow diagram illustrating a process flow for making the semiconductor device of FIG. 1.
Figure 5A:
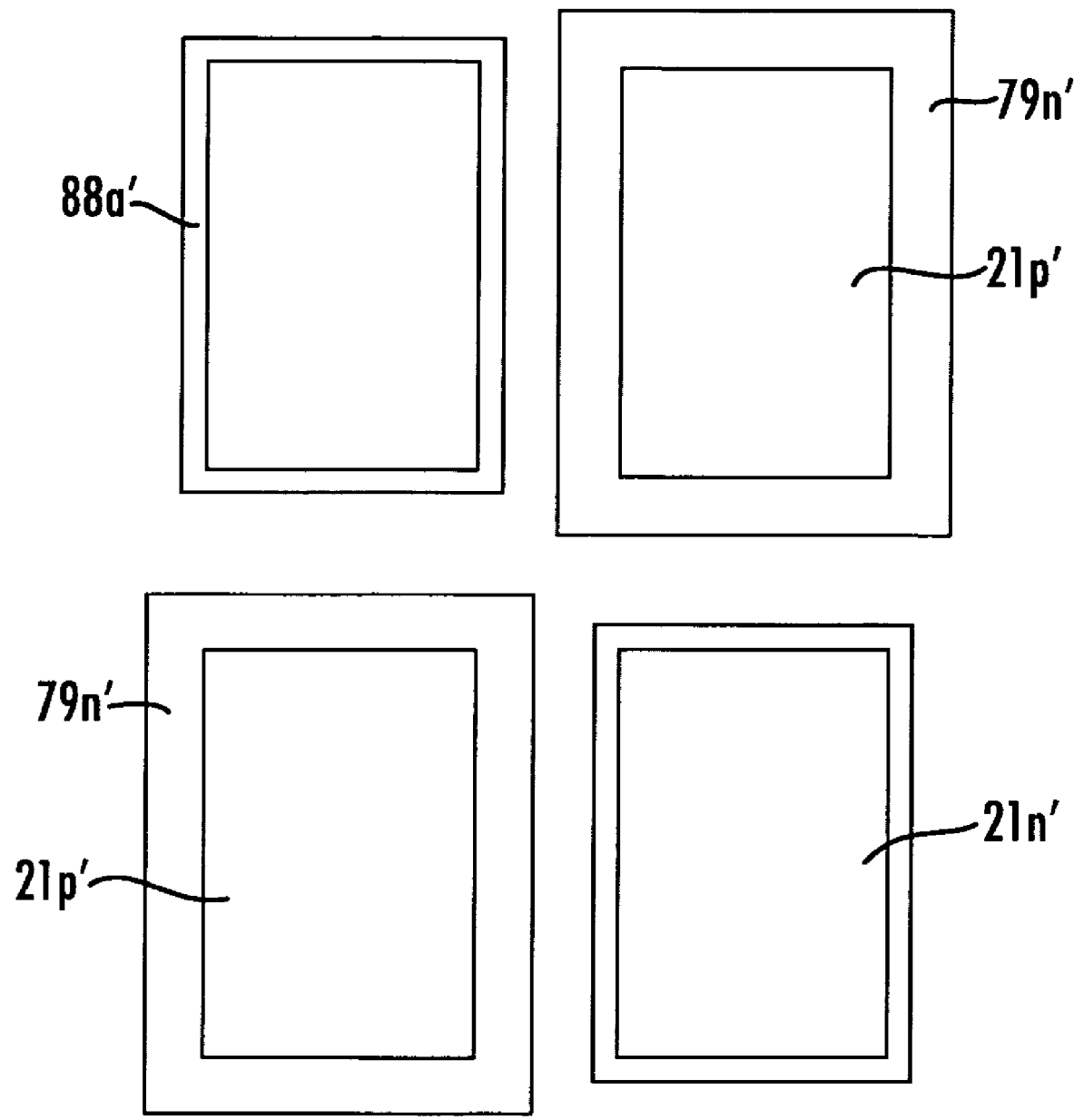
FIGS. 5A and 5B are top views of NFET and PFET channel-stop masks used in the method of FIG. 4.
Figure 5B:
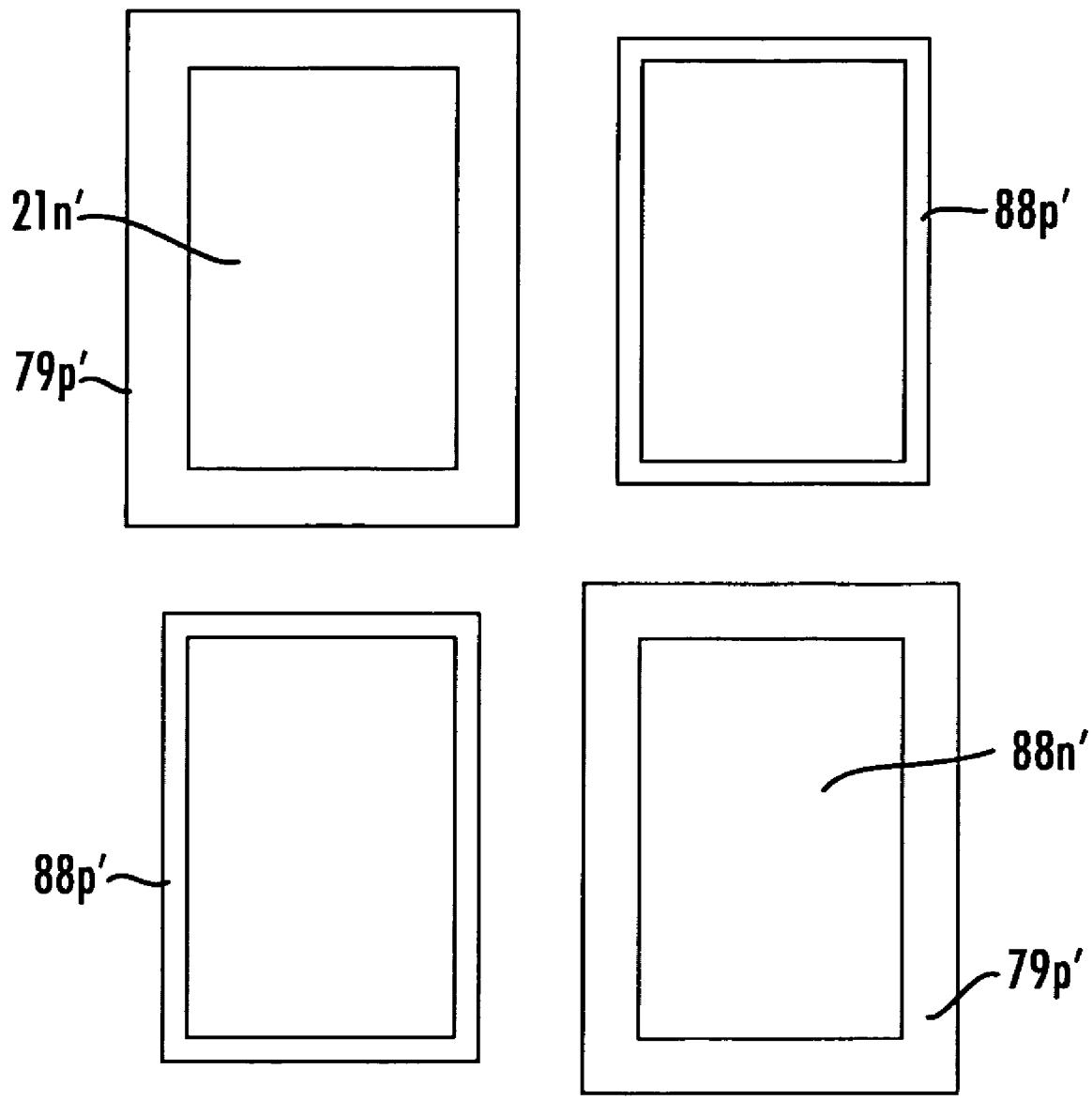

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime and multiple prime notation are used to indicate similar elements in alternate embodiments.

The present invention relates to controlling the properties of semiconductor materials at the atomic or molecular level to achieve improved performance within semiconductor devices. Further, the invention relates to the identification, creation, and use of improved materials for use in the conduction paths of semiconductor devices.

Applicants theorize, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicants use a "conductivity reciprocal effective mass tensor", $M_e^{-1}$ and $M_h^{-1}$ for electrons and holes respectively, defined as:

$$M_{e,ij}^{-1}(E_F, T) = \frac{\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{B.Z.} f(E(k,n), E_F, T) d^3k}$$

for electrons and:

$$M_{h,ij}^{-1}(E_F, T) = \frac{-\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{B.Z.} (1 - f(E(k,n), E_F, T)) d^3k}$$

for holes, where f is the Fermi-Dirac distribution, $E_F$ is the Fermi energy, T is the temperature (Kelvin), E(k,n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicants' definition of the conductivity reciprocal effective mass tensor is such that a tensorial component of the conductivity of the material is greater for greater values of the corresponding component of the conductivity reciprocal effective mass tensor. Again Applicants theorize without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Using the above-described measures, one can select materials having improved band structures for specific purposes. One such example would be a superlattice 25 material for a channel region in a semiconductor device. A planar MOSFET 20 including the superlattice 25 in accordance with the invention is now first described with reference to FIG. 1. One skilled in the art, however, will appreciate that the materials identified herein could be used in many different types of semiconductor devices, such as discrete devices and/or integrated circuits.

The illustrated MOSFET 20 includes a substrate 21 with shallow trench isolation (STI) regions 80, 81 therein More particularly, the MOSFET device 20 may be a complementary MOS (CMOS) device including N and P-channel transistors with respective superlattice channels, in which the STI regions are for electrically insulating adjacent transistors, as will be appreciated by those skilled in the art. By way of example, the substrate 21 may be a semiconductor (e.g., silicon) substrate or a silicon-on-insulator (SOI) substrate. The STI regions 80, 81 may include an oxide such as silicon dioxide, for example, although other suitable materials may be used in other embodiments.

The MOSFET 20 further illustratively includes lightly doped source/drain extension regions 22, 23, more heavily doped source/drain regions 26, 27, and a channel region therebetween provided by the superlattice 25. Halo implant regions 42, 43 are illustratively included between the source and drain regions 26, 27 below the superlattice 25. Source/drain silicide layers 30, 31 overlie the source/drain regions, as will be appreciated by those skilled in the art. A gate 35 illustratively includes a gate dielectric layer 37 adjacent the channel provided by the superlattice 25, and a gate electrode layer 36 on the gate dielectric layer. Sidewall spacers 40, 41 are also provided in the illustrated MOSFET 20, as well as a silicide layer 34 on the gate electrode layer 36.

Process integration of the superlattice 25 into state-of-the-art CMOS flow may require the removal of the superlattice film 25 that is formed over the STI regions 80, 81 to prevent shorting or leakage between adjacent device structures. Referring more particularly to FIGS. 2A-2D through 3, fabrication may begin with the substrate 21 which has the STI regions 80, 81 formed therein as well as a sacrificial oxide layer 85 thereon and a $V_T$ implant 84 (represented by a row of "+" signs). In the case of a crystalline silicon superlattice, which will be described further below, when the sacrificial oxide layer 85 is removed and the superlattice 25 is formed on the substrate 21, the silicon deposition results in non-monocrystalline (i.e., polycrystalline or amorphous) silicon deposits 86, 87 overlying the STI regions 80, 81. However, the non-monocrystalline silicon deposits 86, 87 typically need to be removed to prevent shorting or leakage between adjacent device structures, as noted above.

While a relatively straightforward approach of performing masking with a single baseline active area (AA) photoresist mask 88 (FIG. 2C) and subsequent etching of the non-monocrystalline silicon deposits 86, 87 (FIG. 2D) may be acceptable in some implementations, in other cases this can lead to certain difficulties. More particularly, if the mask is misaligned (resulting in a portion of the non-monocrystalline silicon deposit 86 on STI edges being masked by the photoresist 88) or due to insufficient over-etch during plasma etch, then portions of the the non-monocrystalline silicon deposit on the STI edges and in the STI divots may remain unetched and hence remain as a parasitic device adjacent to the active device, while an active device area adjacent the STI region (due to channel stop mask misalignment) is inadvertently etched leaving a gap 89. The result is that dopant creep may unintentionally occur adjacent the non-monocrystalline silicon portion 86, while non-uniform silicide and source/drain junction leakage substrate may occur adjacent the gap 89.

Accordingly, the masking and etching operations may advantageously be modified to provide non-monocrystalline semiconductor stringers or unetched tabs 82, 83 with channel-stop implants in divots and edges of the STI regions 80, 81, as shown in FIG. 1. Again, the non-monocrystalline semiconductor deposition occurs during the epitaxial growth of the semiconductor monolayers of the superlattice 25, which over the STI regions 80, 81 results in a non-monocrystalline silicon. The non-monocrystalline stringers 82, 83 are preferably advantageously doped with a channel-stop implant dopant, for example, as will be discussed further in the various fabrication examples set forth below.

Referring more particularly to FIGS. 4 through 8, a first process integration flow for making the semiconductor device 20 is now described. Beginning with an STI wafer at Block 90, $V_T$ wells are implanted (through 150 Å pad oxide 85'), at Block 91, followed by a dry etch (120 Å oxide), at Block 92. This is followed by a hydrofluoric acid (HF) exposure (SC1/100:1, 50 Å), at Block 93, In particular, the partial dry etch of the pad oxide 85' and relatively short HF exposure time may help to reduce the depth of the STI divots, for example. Next, the superlattice film 25' is deposited, at Block 94, which will be discussed further below, followed by a cleaning step (SPM/200:1, HF/RCA), at Block 95.

Figure 8A:
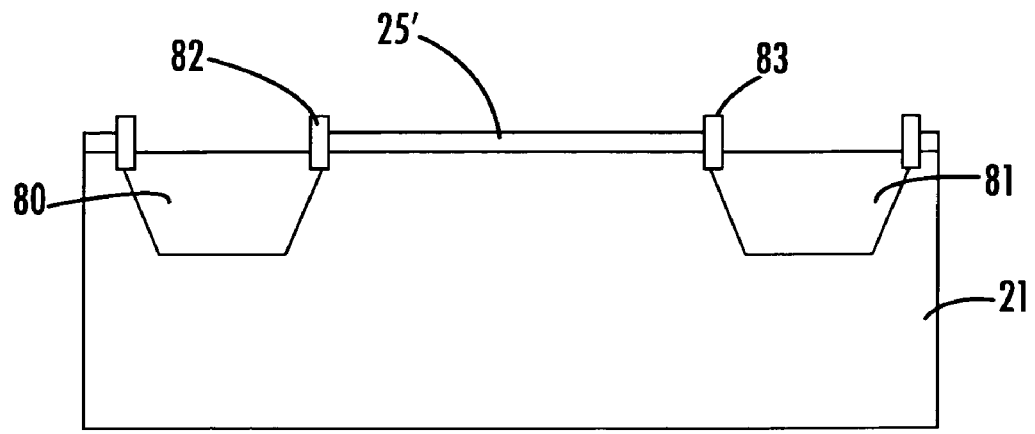
FIGS. 8A through 8C are cross-sectional views illustrating the resist stripping, gate doping, spacer formation, and source/drain doping steps of the method of FIG. 4.
Figure 8B:
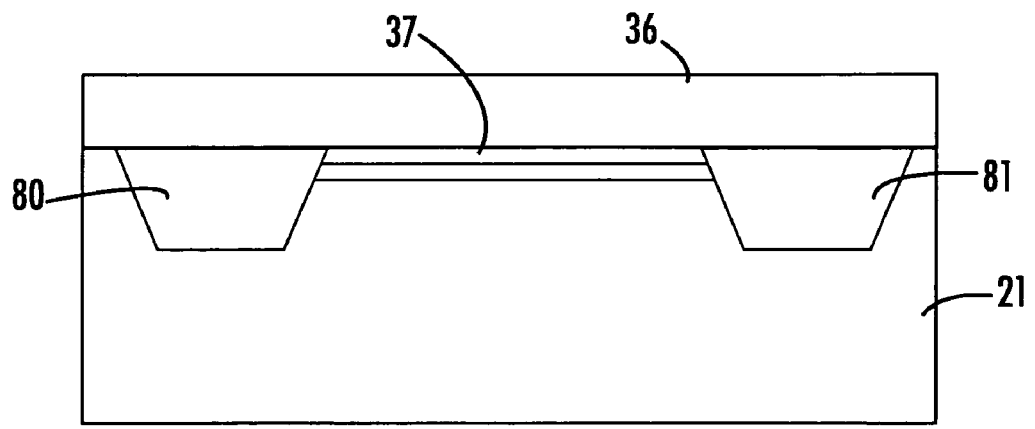
Figure 9:
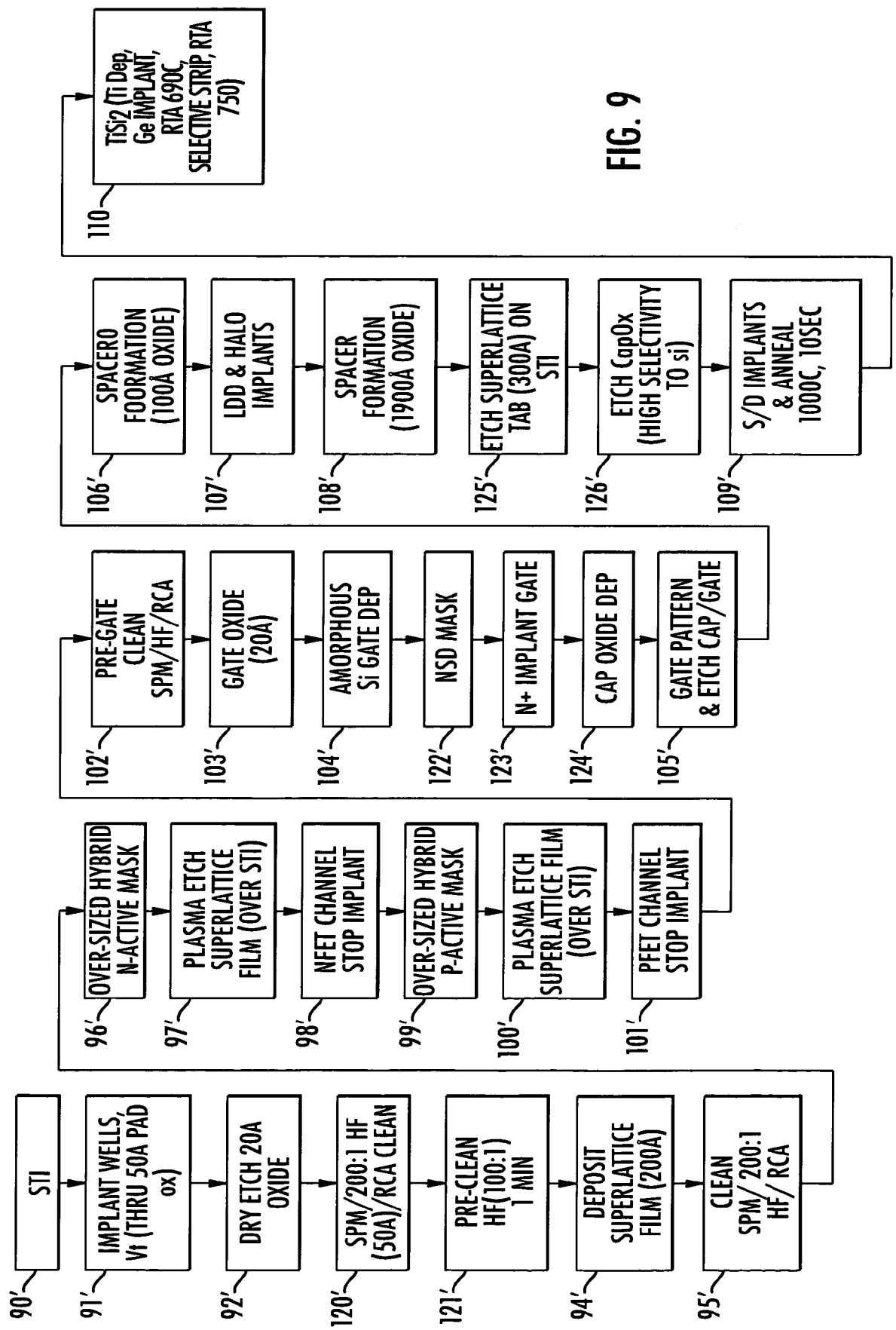
FIG. 9 is a flow diagram illustrating an alternative process flow for making the semiconductor device of FIG. 1.

Rather than using a single baseline AA mask as described above, in the present example a first, oversized N channel AA mask is formed (FIGS. 5A and 6A), at Block 96, followed by a plasma etch of the non-monocrystalline semiconductor material over the STI regions adjacent the N-channel regions (Block 97) and an NFET channel-stop implant (FIG. 9B) using the oversized N channel AA mask, at Block 98. In FIGS. 8A and 8B, the N and P oversized masks are indicated with reference numerals 88n' and 88p', respectively, and the N and P active areas are indicated with reference numerals 21n', 21p', respectively Moreover, reverse N and P wells are indicated with reference numerals 79n' and 79p', respectively.

Figure 6A:
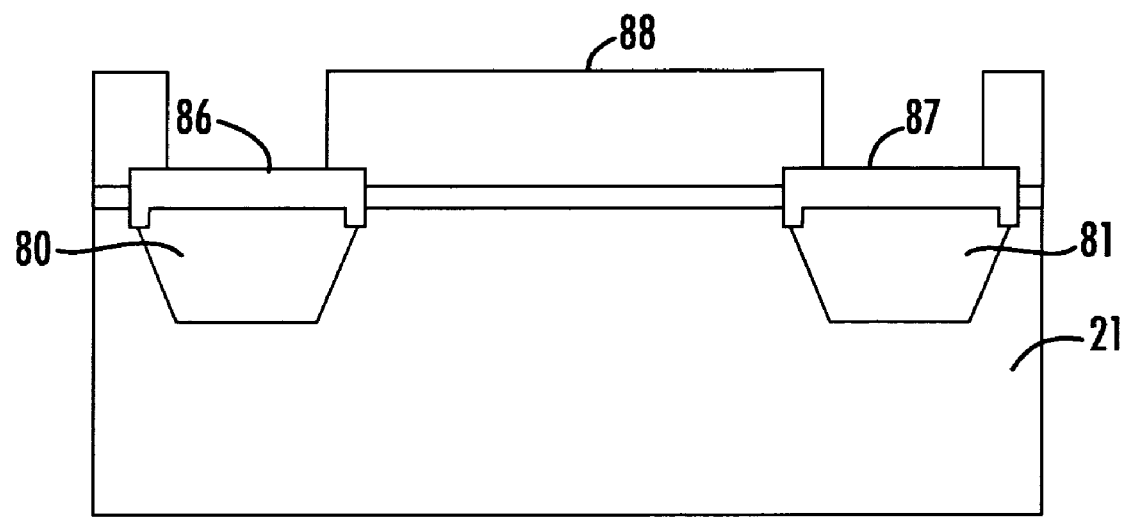
FIGS. 6A through 6B are cross-sectional views illustrating the masking and channel-stop implantation steps of the method of FIG. 4.
Figure 6B:
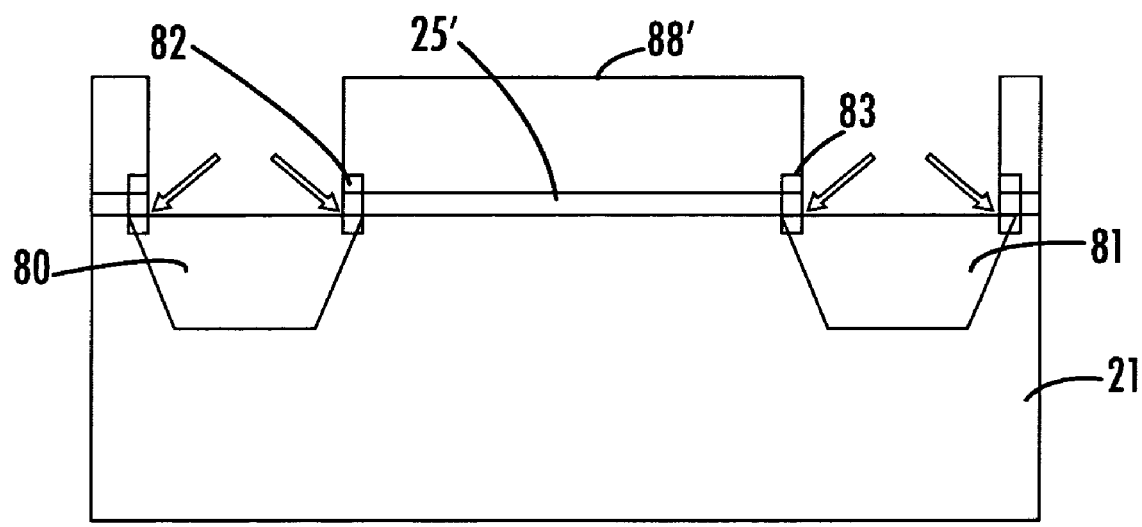
Figure 7:
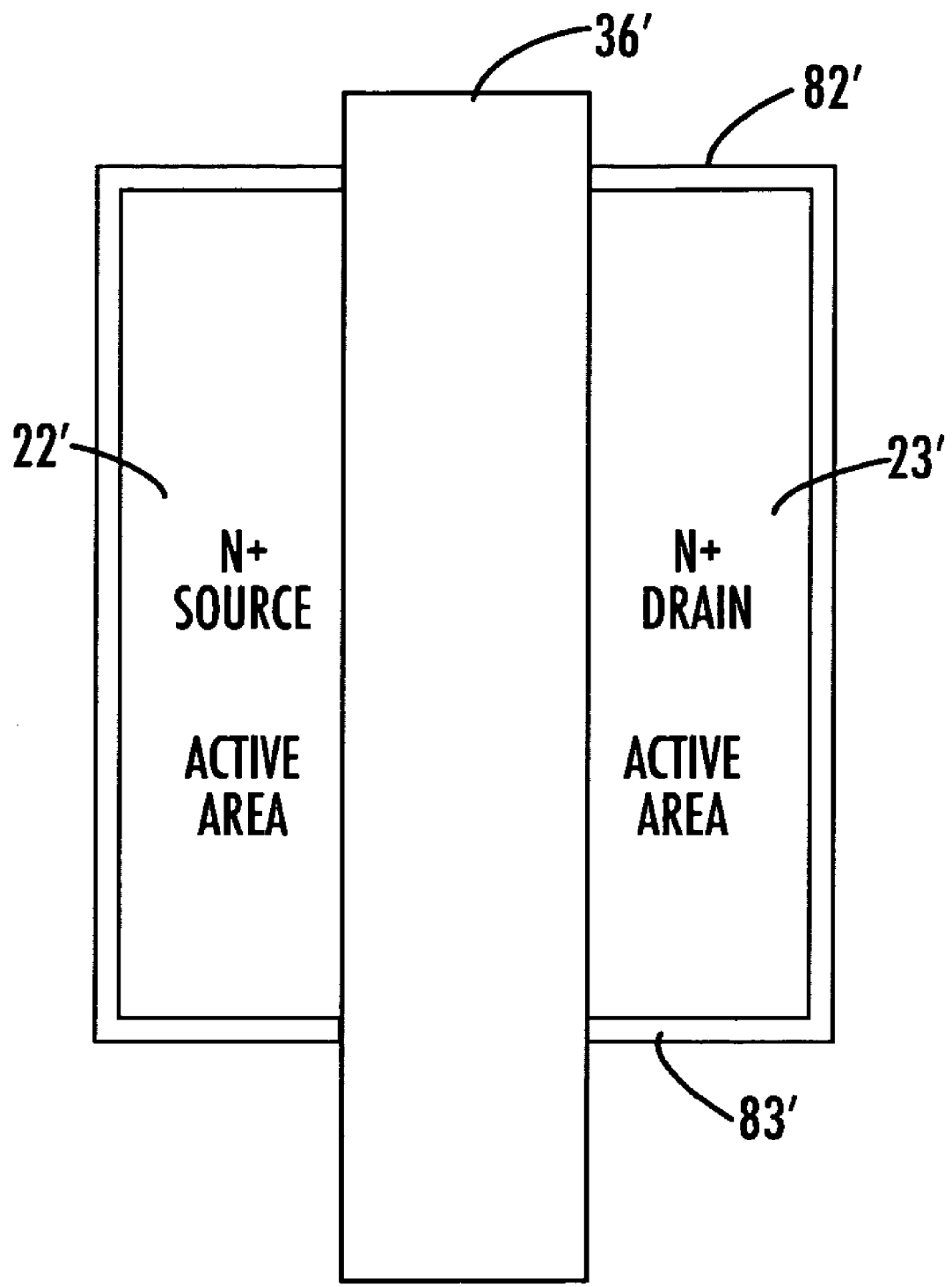
FIG. 7 is a top view of the device structure after gate electrode pattern and etch, showing the device regions where the channel-stop implant is targeted to benefit, as part of the method of FIG. 4.

Next, an over-sized P-channel mask is then formed (FIG. 5B), at Block 99, followed by a plasma etch of the non-monocrystalline silicon over the STI regions adjacent the P-channel region (Block 100) and the PFET channel-stop implantation, at Block 101. The NFET and PFET channel-stop implants are preferably performed at an angle or tilt, such as a thirty degree angle, for example, as illustrated in FIG. 6B, although other angles may also be used. The channel-stop implantations are illustratively shown with arrows in the drawings. By way of example, boron may be used for the NFET channel-stop implant, and arsenic or phosphorous may be used for the PFET channel-stop implant. The stringers 82', 83' in the STI region 80', 81' divots and unetched silicon tabs at STI edges are preferably highly counter-doped by the channel-stop implant to neutralize or lessen the diffusion creep of dopants from source-drain regions into the non-monocrystalline silicon in the STI divots or tabs at the corner of the channel of the device to advantageously provide a higher diode break down voltage, higher threshold voltage and lower off current of this parasitic edge device. The use of two different oversized masks for the P and N channel devices advantageously helps protect the AA alignment marks during the non-monocrystalline silicon etching, as well as to protect each active device during channel stop implant of the opposite type of device.

Figure 8C:
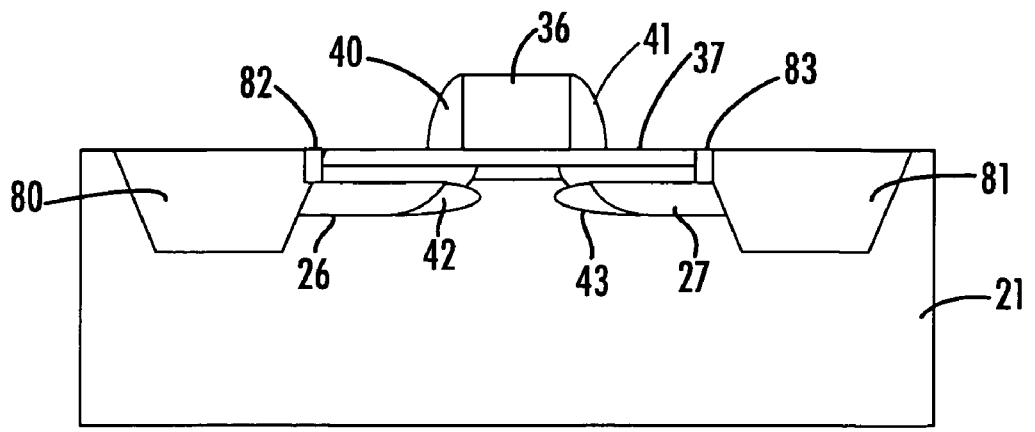

Once the PFET channel-stop implants are completed, a pre-gate clean (SPM/HF/RCA) is performed, at Block 102 (FIG. 8A), followed by gate oxide 37' formation (approximately 20 Å), at Block 103, and non-monocrystalline silicon gate electrode 36 deposition and implantation doping, at Block 104 (FIG. 8B). Gate patterning and etching is then performed, at Block 105, followed by sidewall spacer 40', 41' formation (e.g., 100 Å oxide) (Block 106) and LDD 22', 23 and halo 42', 43' implantations, at Block 107 (FIG. 8C). The spacers 40', 41' are then etched (e.g., 1900 Å oxide), at Block 108. The spacer 40, 41 formation is followed by the source/drain 26', 27' implants and annealing (e.g., 1000° C. for 10 seconds), at Block 109, and silicide formation (Block 110) to provide the device 20 shown in FIG. 1. More particularly, the silicide may be $TiSi_2$ (e.g., Ti deposition, germanium implant, RTA @ 690° C., selective strip, followed by RTA at 750° C).

Figure 12A:
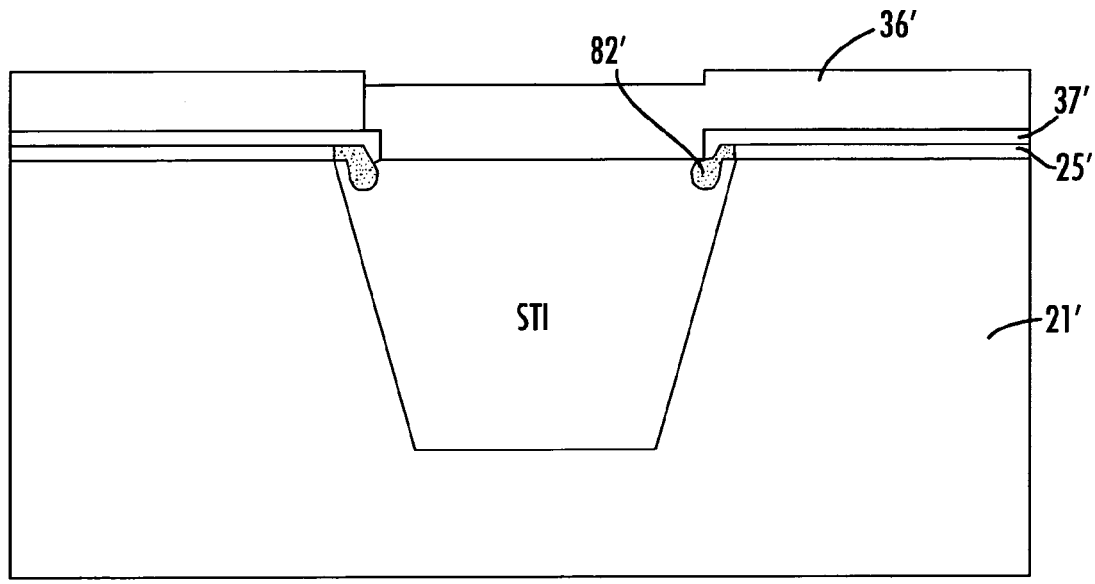
FIGS. 12A and 12B are cross-sectional views of the device structure after silicide formation taken parallel and perpendicular to the gate layer, respectively.
Figure 12B:
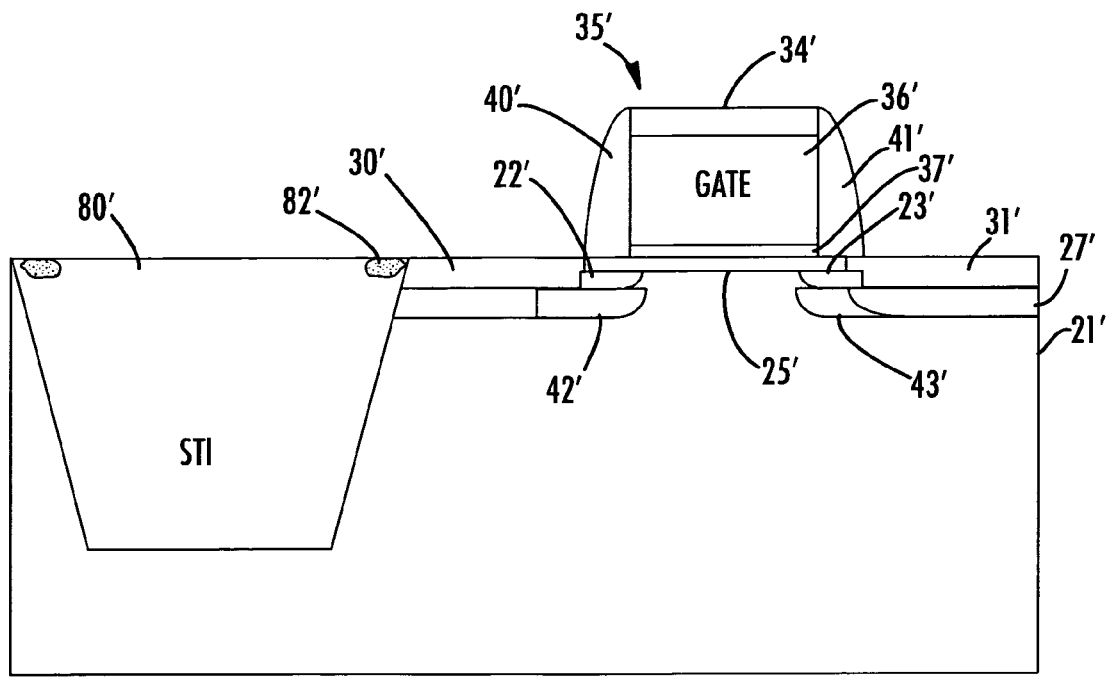

FIGS. 12A and 12B are cross-sectional views of the device structure after silicide formation taken parallel and perpendicular to the gate layer 36', respectively. In these figures, the non-monocrystalline stringers 82', 83' are shown with stippling to indicate that they have been doped with the channel-stop implant. It should be noted that the depth of the silicon recess in the source/drain areas will depend upon the amount of over-etch used to remove the non-monocrystalline stringers and unetched tabs (due to use of oversized active-area channel-stop masks) 82', 83' in the STI divots and STI edges. Moreover, excessive recesses may lead to increased series RSD or loss of contact between the source/drain and the LDD regions, as will be appreciated by those skilled in the art. As such, these depths may require adjustment depending upon the given implantation.

In the above-noted process flow, the NFET and PFET masking, etching of the non-monocrystalline silicon 86', 87' over the STI regions 80', 81', and channel-stop implants are performed prior to gate oxidation. In an alternative process flow now described with reference to FIGS. 9 through 11, the above-described approach is modified so that etching of the non-monocrystalline silicon 86', 87' is performed after the spacer etching step (Block 108'). Moreover, this alternative process flow also uses an oxide or nitride cap film 78" (FIG. 10B) over the gate electrode layer 36" to protect the gate polysilicon from being etched during the etching of the non-monocrystalline silicon 86", 87".

Figure 10A:
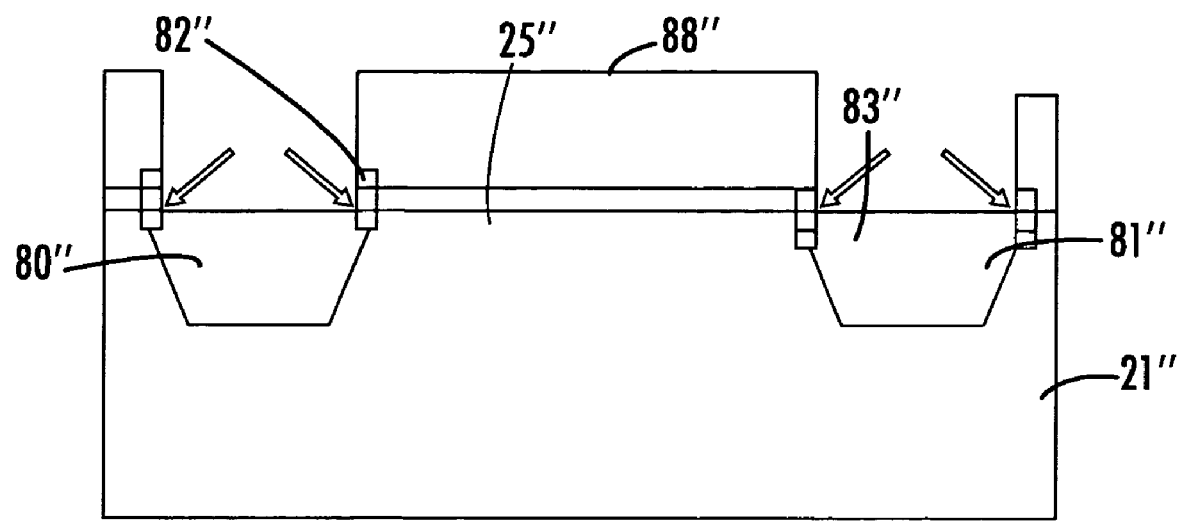
FIGS. 10A through 10B are cross-sectional views illustrating the non-monocrystalline semiconductor etching, channel-stop implant, and gate deposition/implantation steps of the method of FIG. 9.
Figure 10B:
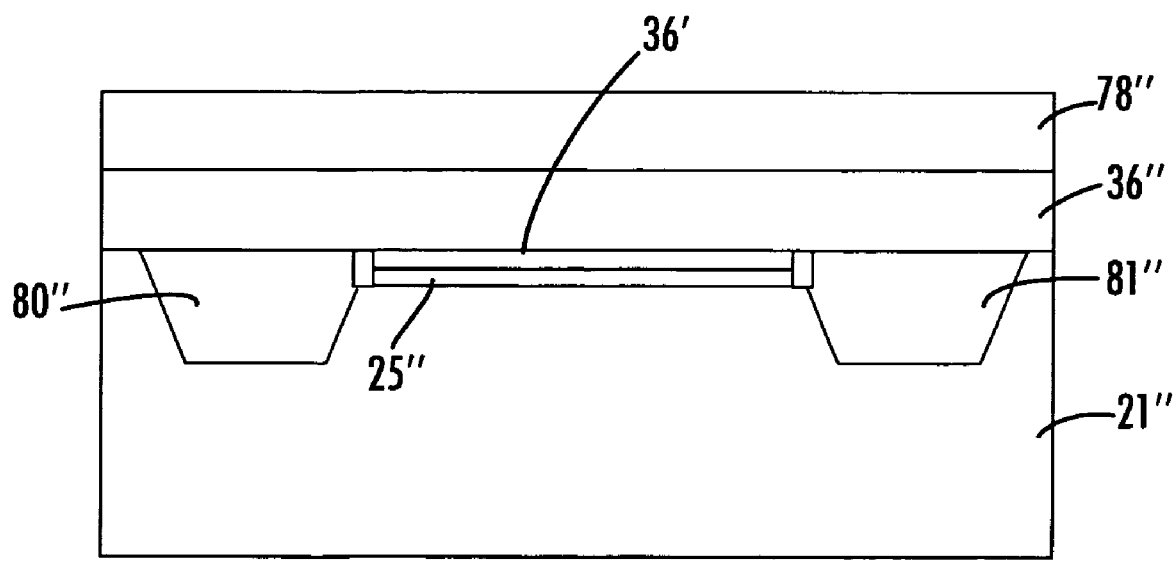
Figure 11:
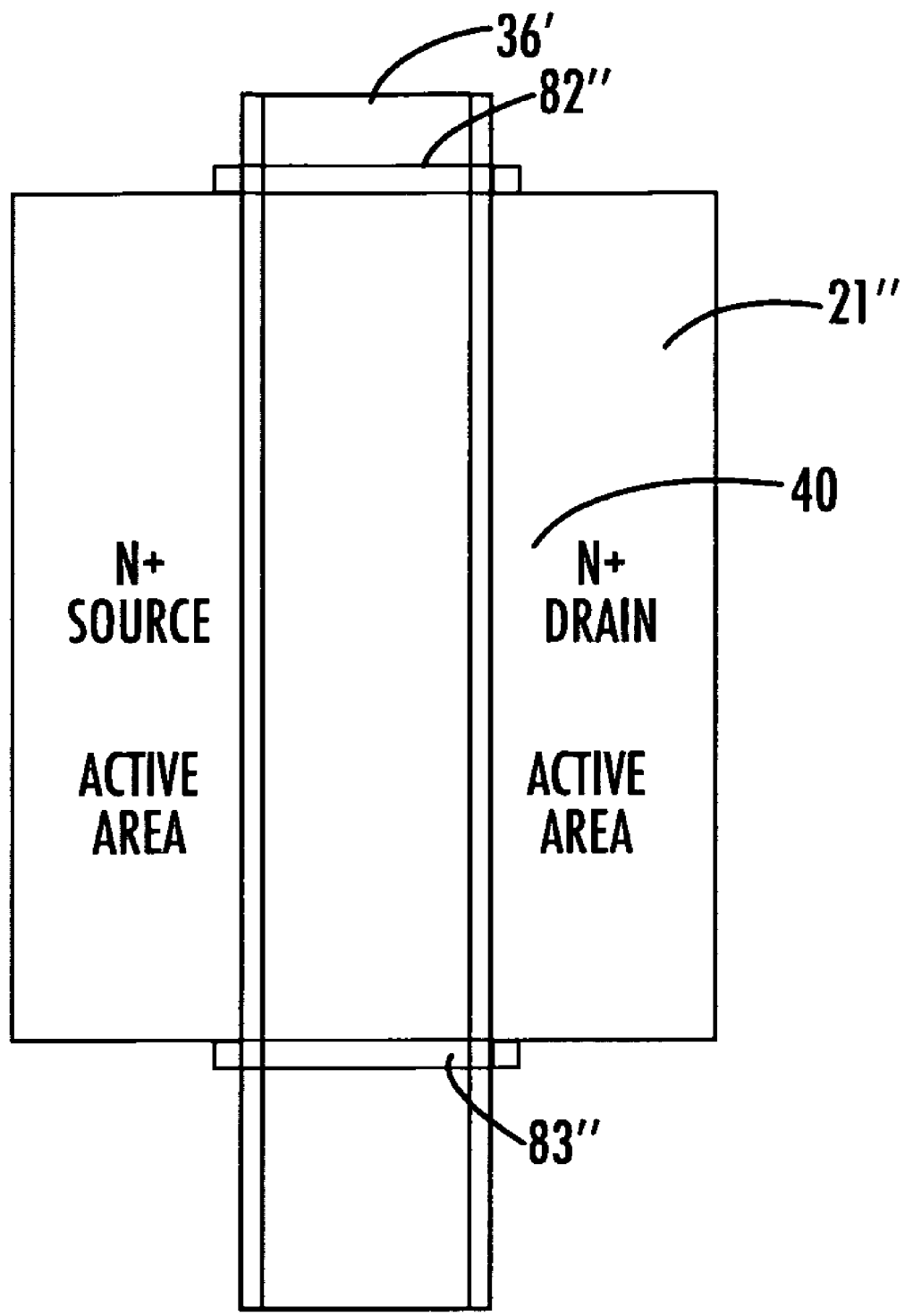
FIG. 11 is a top view of the device structure after the spacer formation step of the method of FIG. 9.

After dry etching (Block 92'), a cleaning step (SPM/200:1, HF (50 Å)/RCA) is performed, at Block 120', followed by an HF pre-clean (100:1) for approximately one minute. For the NFET and PFET masking deposition steps (Blocks 96', 99'), in the present example oversized hybrid photoresist masks are used (FIG. 10A). Additionally, after the non-monocrystalline silicon gate electrode layer 36" deposition (Block 104'), the illustrated method includes an NSD masking step (Block 122'), followed by an N+ gate implant and cap oxide deposition, at Blocks 123', 124'. Other process variations from the above-described approach include an etching of the non-monocrystalline silicon 86", 87" on the STI regions 80", 81" (e.g., 300 Å), at Block 125', followed by etching of the cap oxide layer (with a high selectivity to silicon), at Block 126'. Those remaining process steps not specifically discussed here are similar to those discussed above with reference to FIG. 4.

Figure 13A:
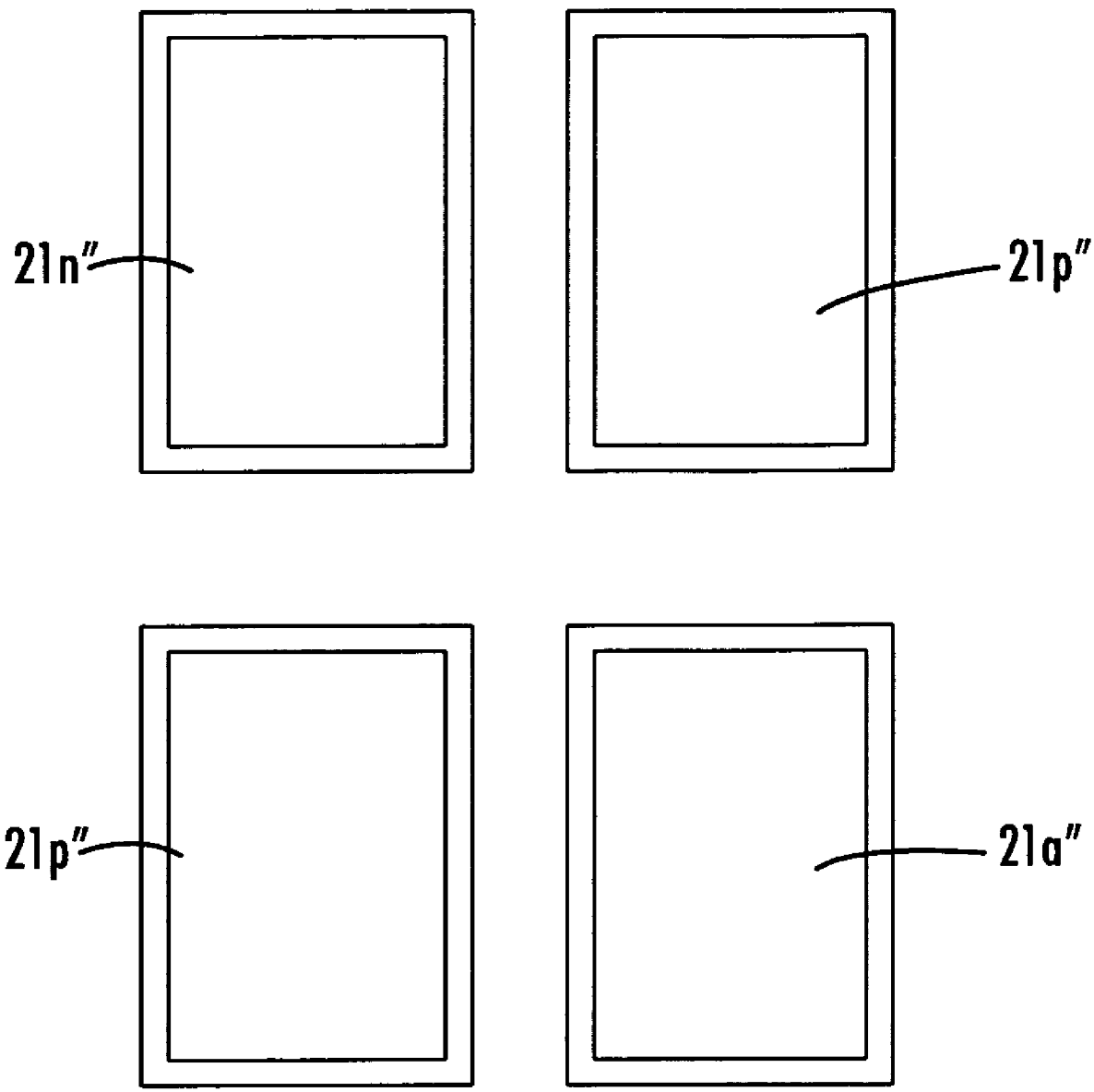
FIGS. 13A and 13B are top views illustrating active area and tab channel-stop masking steps in accordance with another alternative process flow for making the semiconductor device of FIG. 1.
Figure 13B:
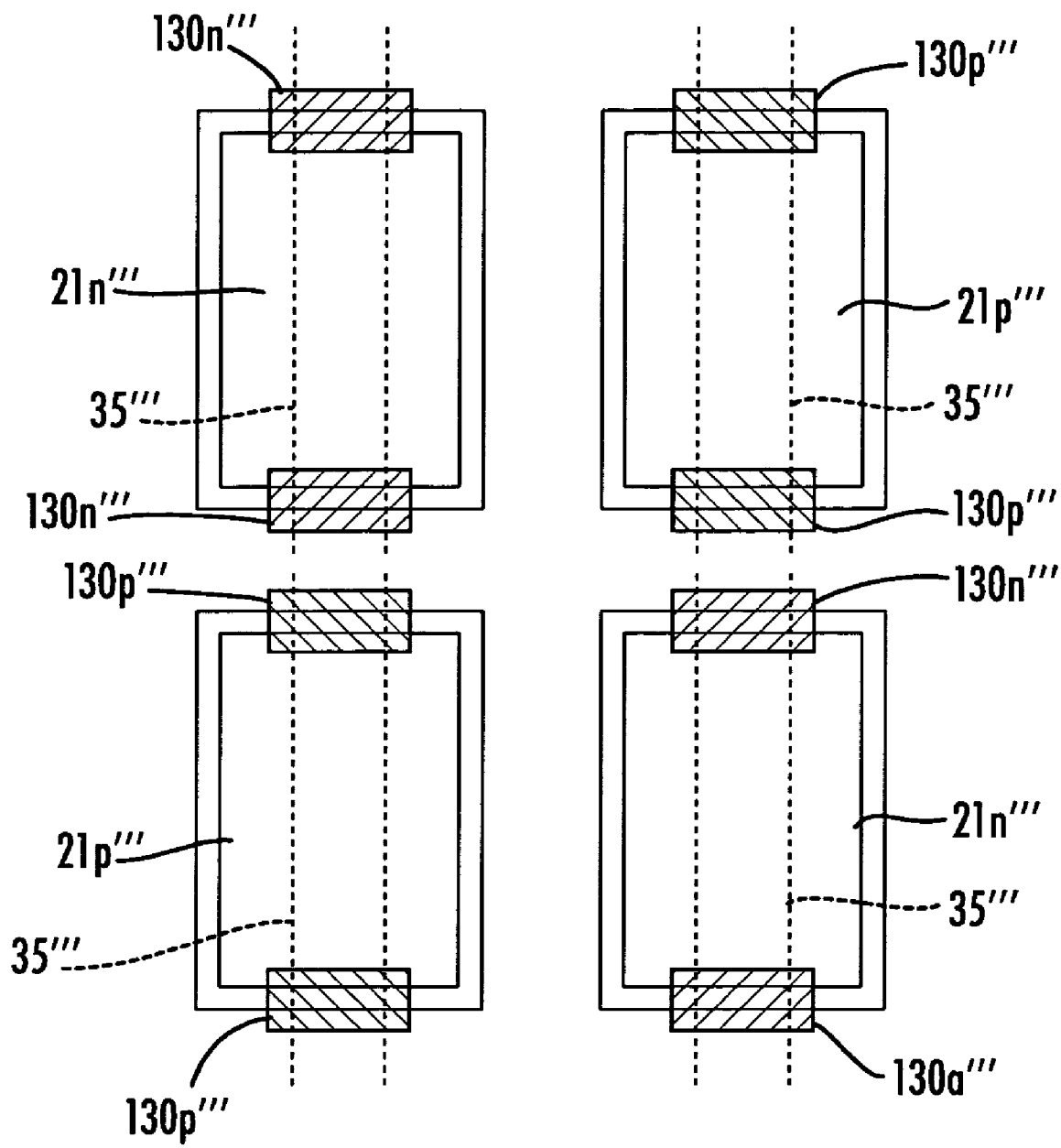

Yet another alternative process flow will now be described with reference to FIGS. 13A and 13B. This process flow uses a common oversized AA mask for etching the non-monocrystalline silicon 86''', 87''' on the STI regions 80''', 81''', followed by two separate masking steps for patterning tab openings. More particularly, an NFET channel-stop mask 130n''' and a PFET channel-stop mask 130p''' are used (FIG. 13B). The NFET and PFET masking steps are followed by channel-stop implantation steps to dope the non-monocrystalline silicon in the tab openings. The foregoing steps may be performed prior to gate oxidation.

It will be appreciated that the exemplary process flows outlined above advantageously allow the etching of the non-monocrystalline semiconductor material on the STI regions prior to gate oxide growth. In addition, the channel-stop implants with appropriate energy and dose would electrically neutralize dopant diffusion from adjacent source and drain regions into any unetched superlattice stringers inadvertently hiding in recessed STI divots at active area edges or tabs of the non-monocrystalline silicon on the STI oxide, surrounding the active area due to the over-sized active-area mask. Of course, it will be appreciated that other suitable materials and process flow parameters besides the exemplary ones noted above may be used in different implementations.

Improved materials or structures for the channel region of the MOSFET 20 having energy band structures for which the appropriate conductivity effective masses for electrons and/or holes are substantially less than the corresponding values for silicon will now be described, Referring now additionally to FIGS. 14 and 15, the superlattice 25 has a structure that is controlled at the atomic or molecular level and may be formed using known techniques of atomic or molecular layer deposition. The superlattice 25 includes a plurality of layer groups 45a-45n arranged in stacked relation, as noted above, as perhaps best understood with specific reference to the schematic cross-sectional view of FIG. 14.

Each group of layers 45a-45n of the superlattice 25 illustratively includes a plurality of stacked base semiconductor monolayers 46 defining a respective base semiconductor portion 46a-46n and an energy band-modifying layer 50 thereon. The energy band-modifying layers 50 are indicated by stippling in FIG. 14 for clarity of illustration.

The energy-band modifying layer 50 illustratively includes one non-semiconductor monolayer constrained within a crystal lattice of adjacent base semiconductor portions. That is, opposing base semiconductor monolayers 46 in adjacent groups of layers 45a-45n are chemically bound together. For example, in the case of silicon monolayers 46, some of the silicon atoms in the upper or top semiconductor monolayer of the group of monolayers 46a will be covalently bonded with silicon atoms in the lower or bottom monolayer of the group 46b. This allows the crystal lattice to continue through the groups of layers despite the presence of the non-semiconductor monolayer(s) (e.g., oxygen monolayer(s)). Of course, there will not be a complete or pure covalent bond between the opposing silicon layers 46 of adjacent groups 45a-45n as some of the silicon atoms in each of these layers will be bonded to non-semiconductor atoms (i.e., oxygen in the present example), as will be appreciated by those skilled in the art.

In other embodiments, more than one non-semiconductor layer monolayer may be possible. By way of example, the number of non-semiconductor monolayers in the energy band-modifying layer 50 may preferably be less than about five monolayers to thereby provide desired energy band-modifying properties.

It should be noted that reference herein to a non-semiconductor or semiconductor monolayer means that the material used for the monolayer would be a non-semiconductor or semiconductor if formed in bulk. That is, a single monolayer of a material, such as semiconductor, may not necessarily exhibit the same properties that it would if formed in bulk or in a relatively thick layer, as will be appreciated by those skilled in the art.

Applicants theorize without wishing to be bound thereto that energy band-modifying layers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure, while also advantageously functioning as an insulator between layers or regions vertically above and below the superlattice. Moreover, as noted above, this structure also advantageously provides a barrier to dopant and/or material bleed or diffusion and to carrier flow between layers vertically above and below the superlattice 25.

It is also theorized that the superlattice 25 provides a higher charge carrier mobility based upon the lower conductivity effective mass than would otherwise be present. Of course, all of the above-described properties of the superlattice 25 need not be utilized in every application. For example, in some applications the superlattice 25 may only be used for its dopant blocking/insulation properties or its enhanced mobility, or it may be used for both in other applications, as will be appreciated by those skilled in the art.

A cap layer 52 is on an upper layer group 45n of the superlattice 25. The cap layer 52 may comprise a plurality of base semiconductor monolayers 46. The cap layer 52 may have between 2 to 100 monolayers of the base semiconductor, and, more preferably between 10 to 50 monolayers. Other thicknesses may be used as well.

Each base semiconductor portion 46a-46n may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing, as will be appreciated by those skilled in the art.

It should be noted that the term "monolayer" is meant to include a single atomic layer and also a single molecular layer. It is also noted that the energy band-modifying layer 50 provided by a single monolayer is also meant to include a monolayer wherein not all of the possible sites are occupied. For example, with particular reference to the atomic diagram of FIG. 15, a 4/1 repeating structure is illustrated for silicon as the base semiconductor material, and oxygen as the energy band-modifying material. Only half of the possible sites for oxygen are occupied.

In other embodiments and/or with different materials this one half occupation would not necessarily be the case as will be appreciated by those skilled in the art. Indeed it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without wishing to be bound thereto, that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIGS. 14 and 15, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons and holes, or just one of these types of charge carriers, as will be appreciated by those skilled in the art. It may also be beneficial to have a decreased carrier mobility in a direction perpendicular to the groups of layers.

The lower conductivity effective mass for the 4/1 Si/O embodiment of the superlattice 25 may be less than two-thirds the conductivity effective mass than would otherwise occur, and this applies for both electrons and holes. It may be especially appropriate to dope some portion of the superlattice 25 in some embodiments, particularly when the superlattice is to provide a portion of a channel as in the device 20, for example. In other embodiments, it may be preferably to have one or more groups of layers 45 of the superlattice 25 substantially undoped depending upon its position within the device.

Figure 16:
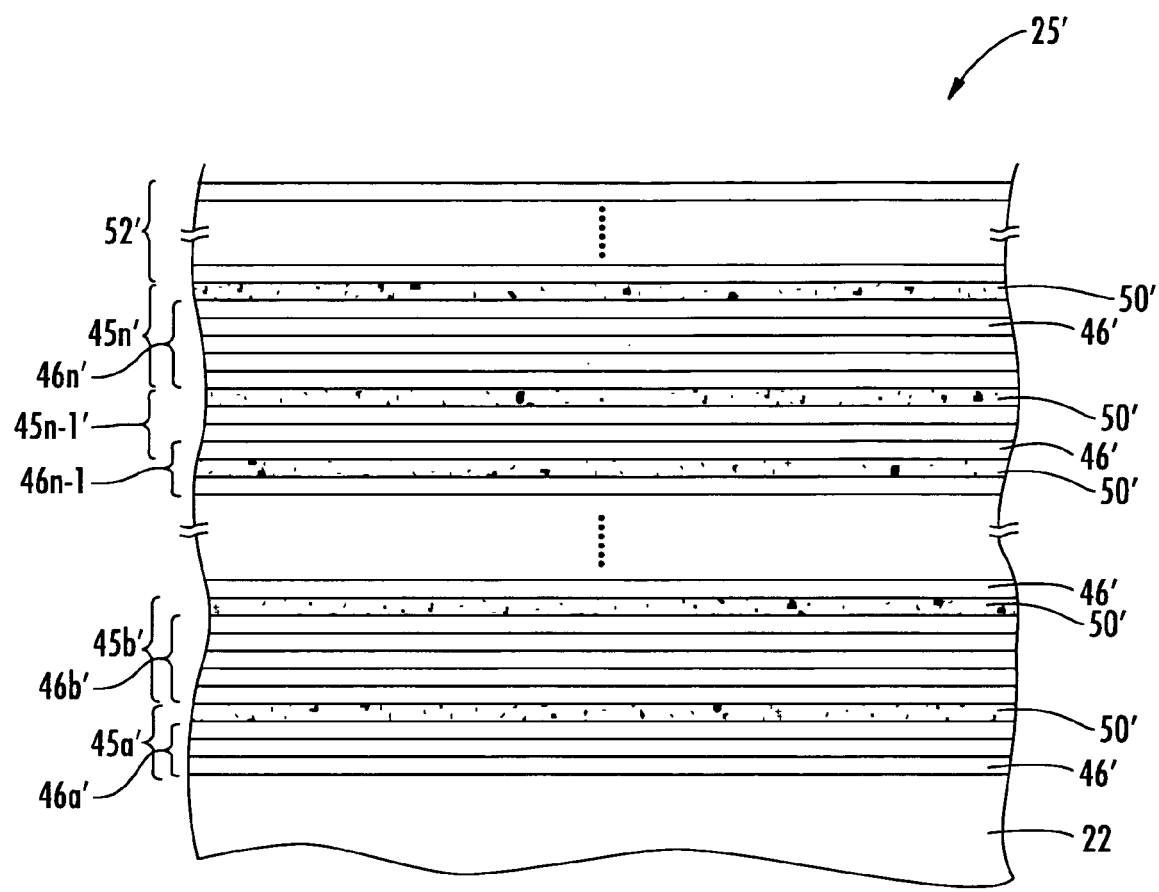
FIG. 16 is a greatly enlarged schematic cross-sectional view of another embodiment of a superlattice that may be used in the device of FIG. 1.

Referring now additionally to FIG. 16, another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 16 not specifically mentioned are similar to those discussed above with reference to FIG. 14 and need no further discussion herein.

In some device embodiments, all of the base semiconductor portions 46a-46n of a superlattice 25 may be a same number of monolayers thick. In other embodiments, at least some of the base semiconductor portions 46a-46n may be a different number of monolayers thick. In still other embodiments, all of the base semiconductor portions 46a-46n may be a different number of monolayers thick.

Figure 17A:
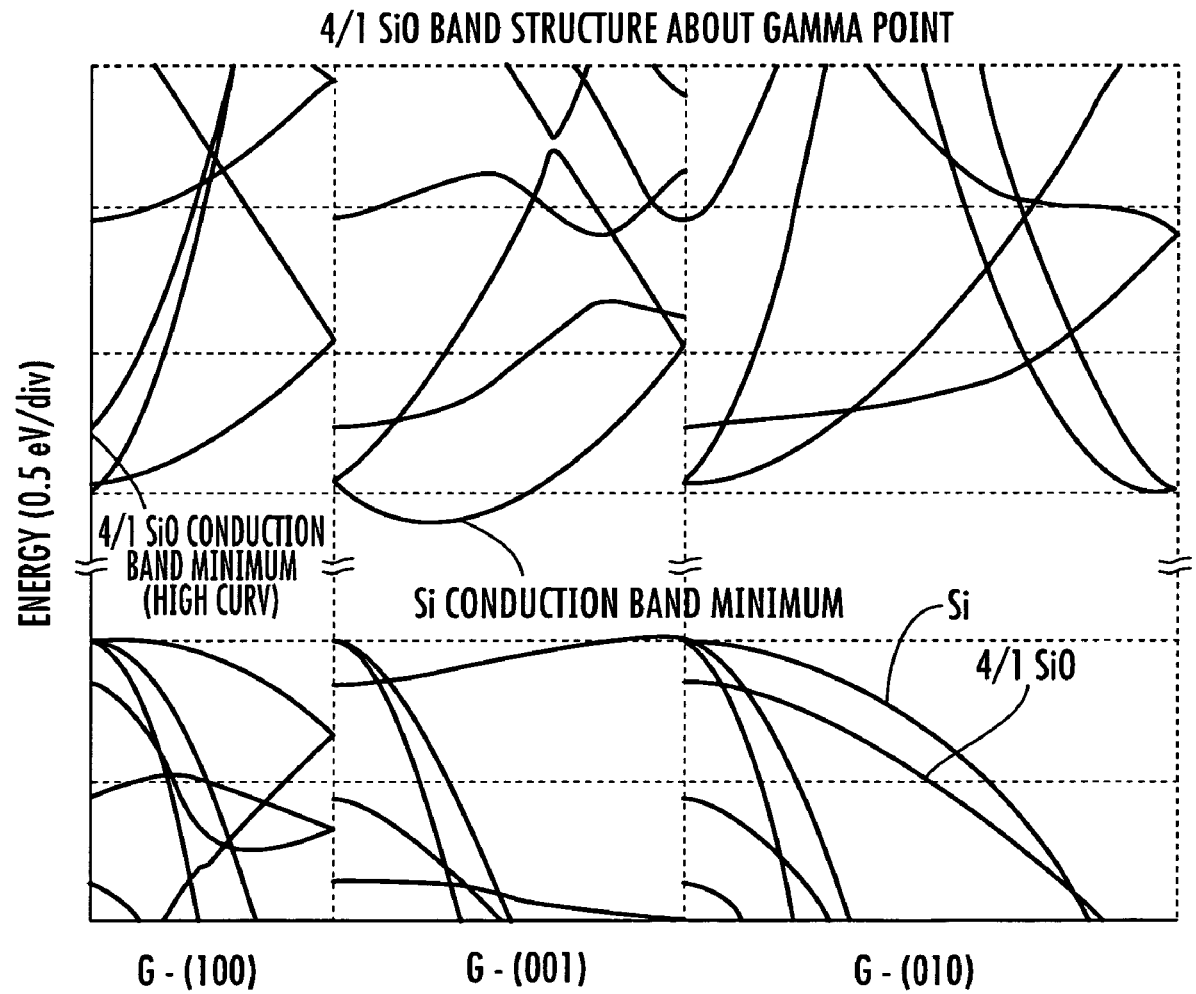
FIG. 17A is a graph of the calculated band structure from the gamma point (G) for both bulk silicon as in the prior art, and for the 4/1 Si/O superlattice as shown in FIG. 14.
Figure 17B:
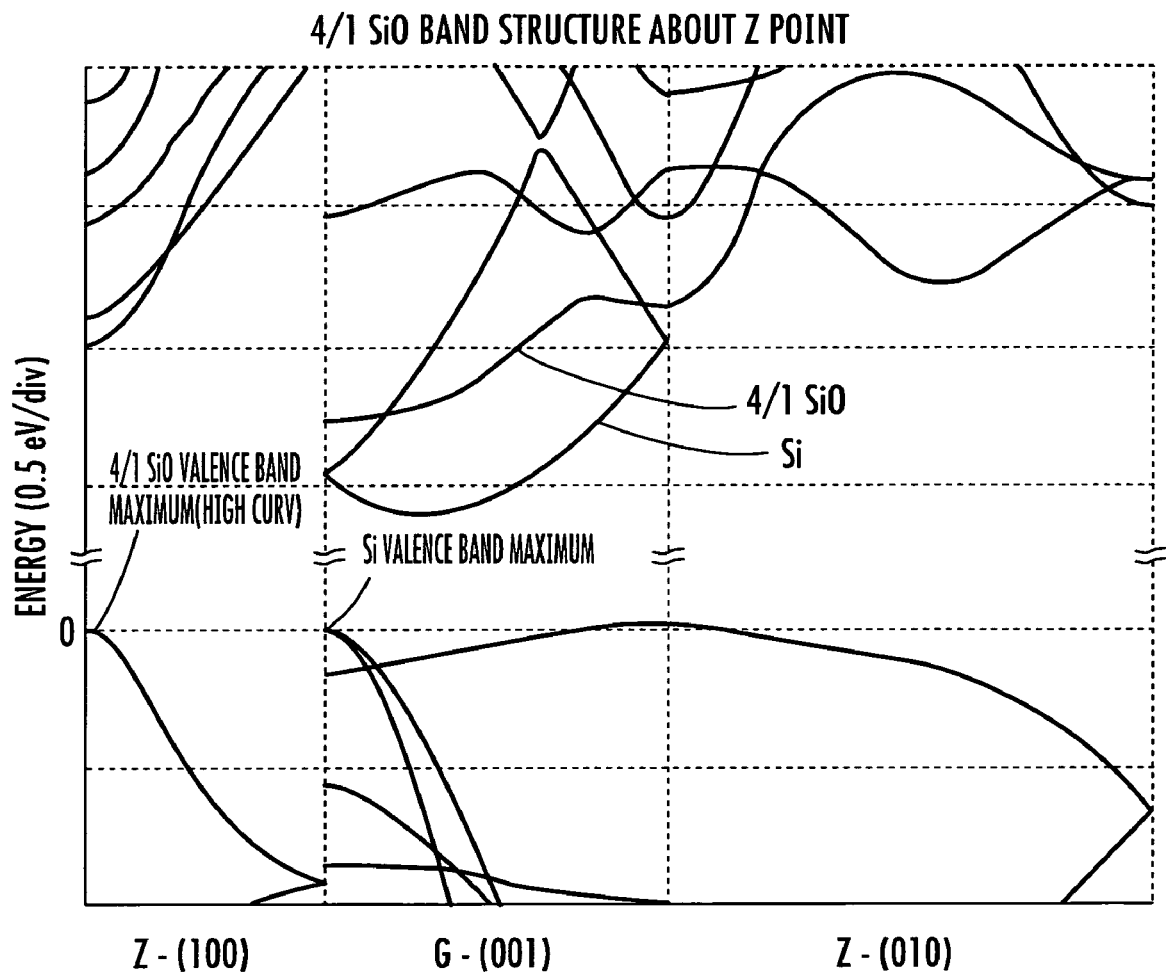
FIG. 17B is a graph of the calculated band structure from the Z point for both bulk silicon as in the prior art, and for the 4/1 Si/O superlattice as shown in FIG. 14.
Figure 17C:
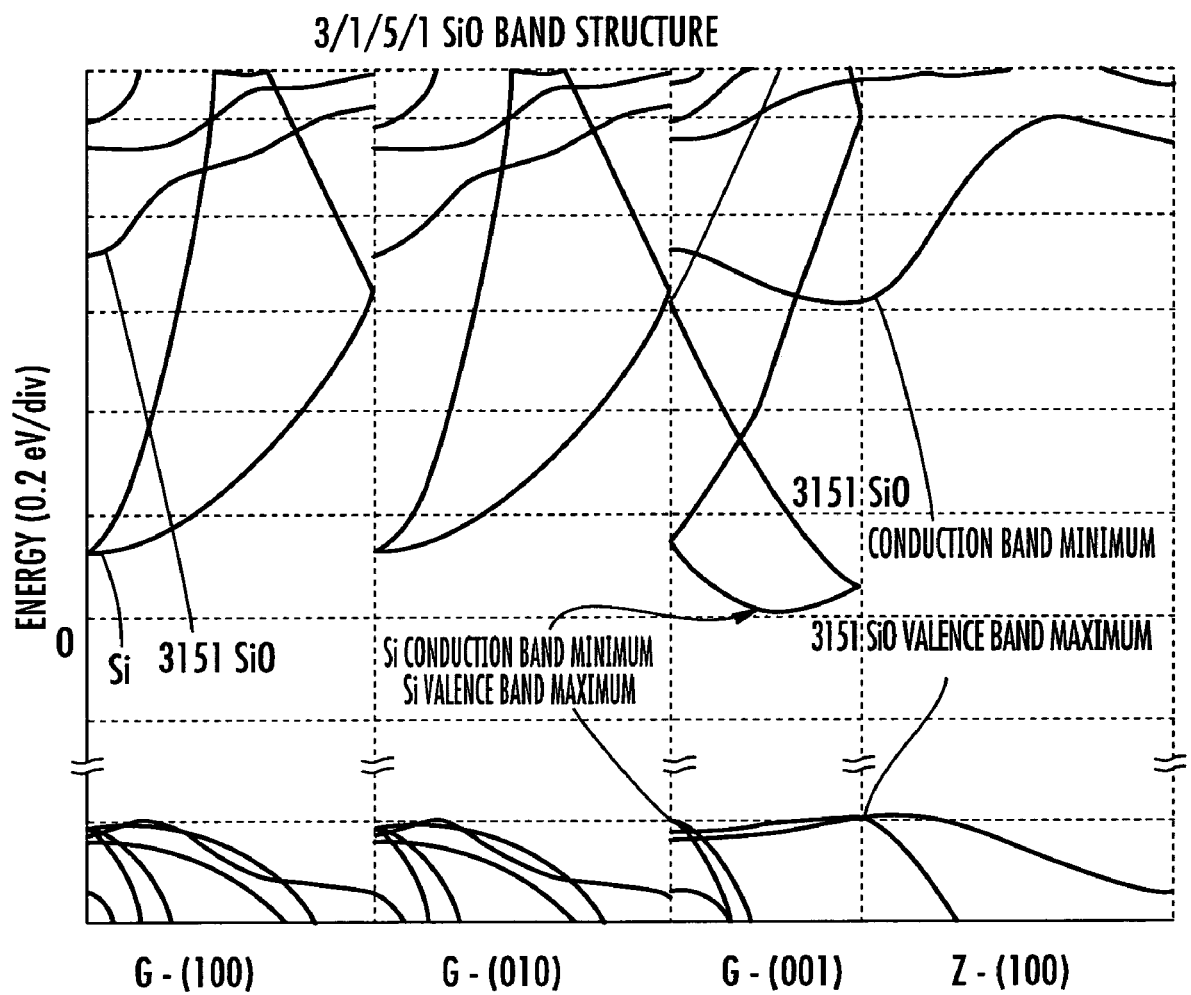
FIG. 17C is a graph of the calculated band structure from both the gamma and Z points for both bulk silicon as in the prior art, and for the 5/1/3/1 Si/O superlattice as shown in FIG. 16.

In FIGS. 17A-17C band structures calculated using Density Functional Theory (DFT) are presented. It is well known in the art that DFT underestimates the absolute value of the bandgap. Hence all bands above the gap may be shifted by an appropriate "scissors correction." However the shape of the band is known to be much more reliable, The vertical energy axes should be interpreted in this light.

Figure 14:
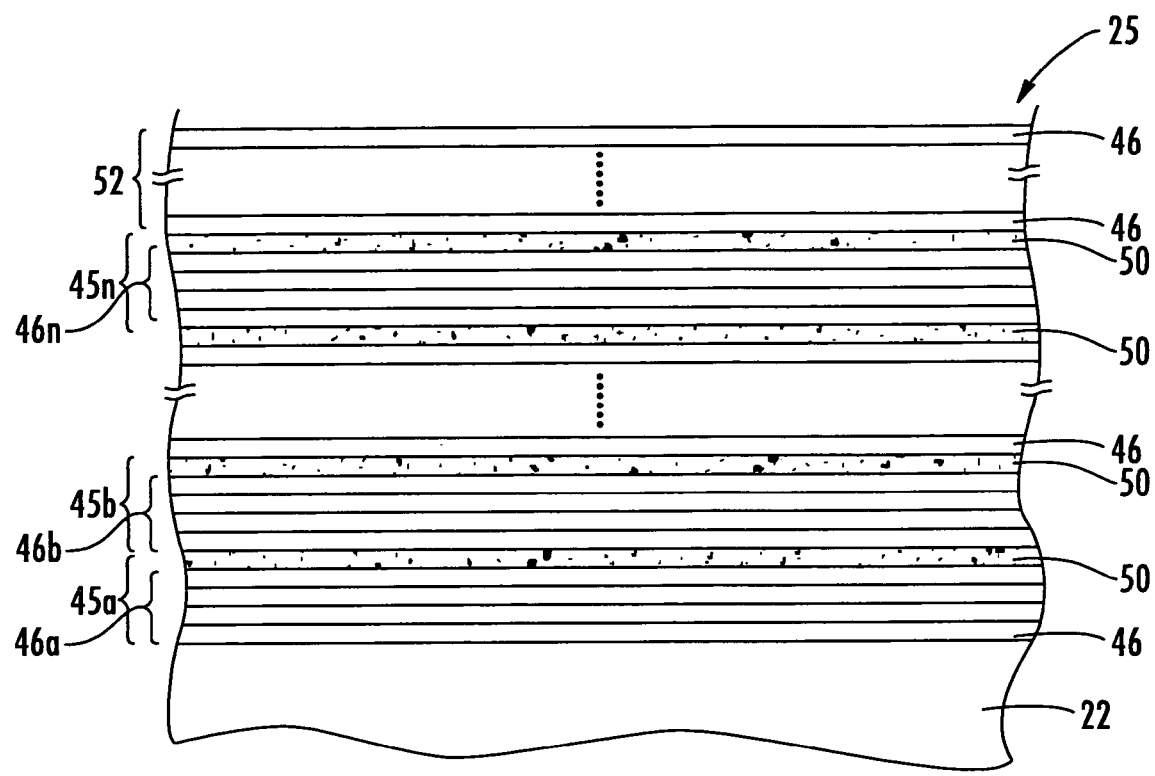
FIG. 14 is a greatly enlarged schematic cross-sectional view of the superlattice as shown in FIG. 1.
Figure 15:
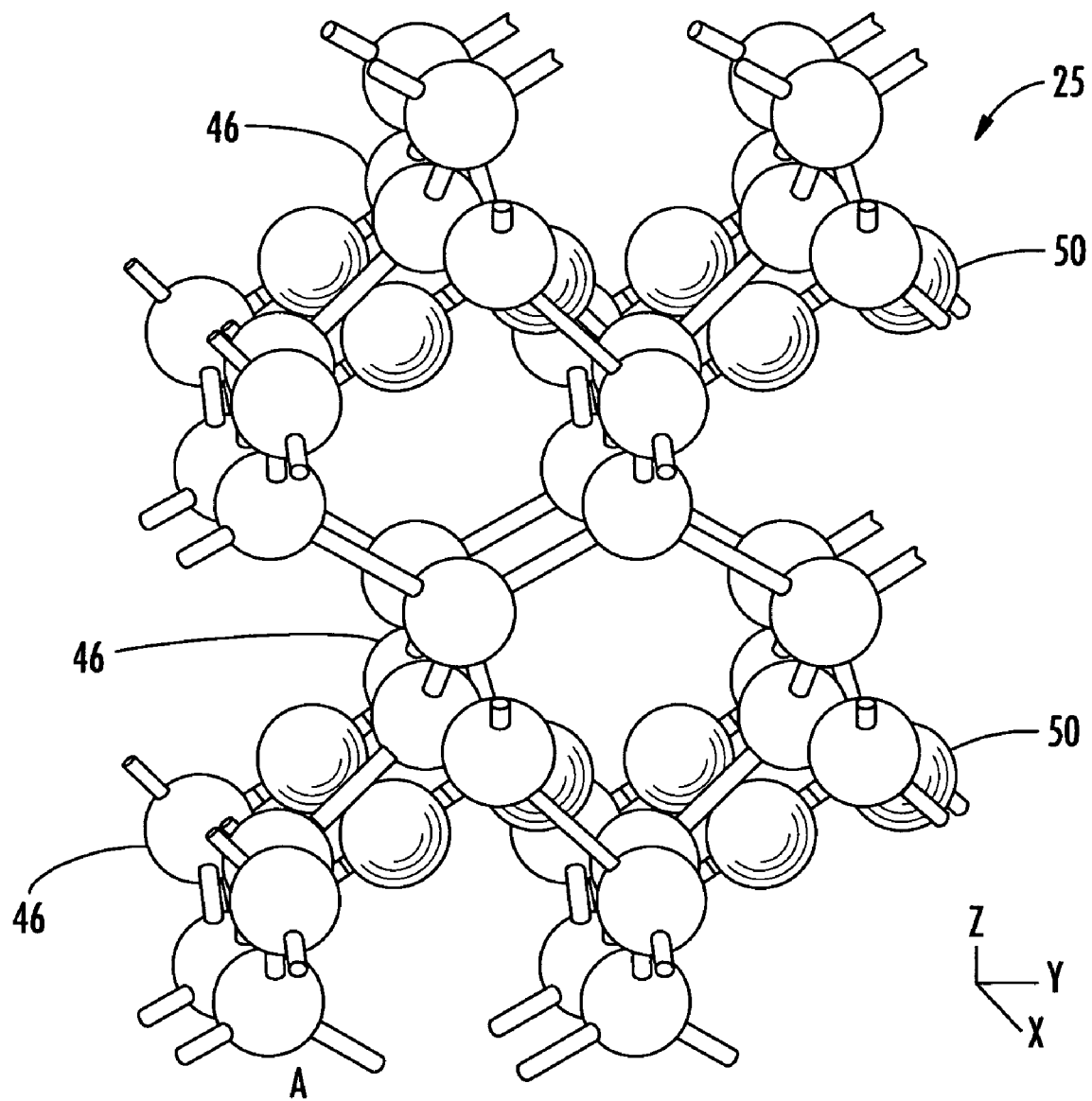
FIG. 15 is a perspective schematic atomic diagram of a portion of the superlattice shown in FIG. 14.

FIG. 17A shows the calculated band structure from the gamma point (G) for both bulk silicon (represented by continuous lines) and for the 4/1 Si/O superlattice 25 as shown in FIG. 14 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (−110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 17B shows the calculated band structure from the Z point for both bulk silicon (continuous lines) and for the 4/1 Si/O superlattice 25 (dotted lines) of FIG. 14. This figure illustrates the enhanced curvature of the valence band in the (100) direction.

FIG. 17C shows the calculated band structure from both the gamma and Z point for both bulk silicon (continuous lines) and for the 5/1/3/1 Si/O structure of the superlattice 25' of FIG. 16 (dotted lines). Due to the symmetry of the 5/1/3/1 Si/O structure, the calculated band structures in the (100) and (010) directions are equivalent. Thus the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicants to further theorize that the 5/1/3/1 superlattice 25' should be substantially direct bandgap. As will be understood by those skilled in the art, the appropriate matrix element for optical transition is another indicator of the distinction between direct and indirect bandgap behavior.

Many modifications and other embodiments will come to the mind of one skilled in the art having the benefit of the teachings presented in the foregoing descriptions and the associated drawings. Therefore, it is understood that such modifications and embodiments are intended to be included within the scope of the appended claims.

That which is claimed is:

1. A method for making a semiconductor device comprising:
   forming a plurality of shallow trench isolation (STI) regions in a semiconductor substrate;
   depositing a plurality of layers over the substrate to define respective superlattices over the substrate between adjacent STI regions and to define respective non-monocrystalline regions over the STI regions, each superlattice comprising a plurality of stacked groups of layers with each group comprising a plurality of stacked base semiconductor monolayers defining a base semiconductor portion and at least one non-semiconductor monolayer thereon, and with the at least one non-semiconductor monolayer being constrained within a crystal lattice of adjacent base semiconductor portions; and
   selectively removing at least portions of the non-monocrystalline regions using at least one active area (AA) mask.

2. The method according to claim 1 wherein the at least one AA mask comprises a single baseline AA mask.

3. The method according to claim 1 wherein selectively removing comprises:
   patterning a photoresist layer with the at least one AA mask to expose the non-monocrystalline regions; and
   performing at least one plasma etching of the exposed non-monocrystalline regions.

4. The method according to claim 1 wherein each non-semiconductor layer is a single monolayer thick.

5. The method according to claim 1 wherein each base semiconductor portion is less than eight monolayers thick.

6. The method according to claim 1 wherein the superlattice further comprises a base semiconductor cap layer on an uppermost group of layers.

7. The method according to claim 1 wherein all of the base semiconductor portions are a same number of monolayers thick.

8. The method according to claim 1 wherein at least some of the base semiconductor portions are a different number of monolayers thick.

9. The method according to claim 1 wherein all of the base semiconductor portions are a different number of monolayers thick.

10. The method according to claim 1 wherein each base semiconductor portion comprises a base semiconductor selected from the group consisting of Group IV semiconductors, Group III-V semiconductors, and Group II-VI semiconductors.

11. The method according to claim 1 wherein each non-semiconductor layer comprises a non-semiconductor selected from the group consisting of oxygen, nitrogen, fluorine, and carbon-oxygen.

12. The method according to claim 1 wherein opposing base semiconductor portions in adjacent groups of layers are chemically bound together.

13. method for making a semiconductor CMOS device comprising:
   forming a plurality of shallow trench isolation (STI) regions in a semiconductor substrate;
   depositing a plurality of layers over the substrate to define respective superlattices over the substrate between adjacent STI regions and to define respective non-monocrystalline regions over the STI regions, each superlattice comprising a plurality of stacked groups of layers with each group comprising a plurality of stacked base semiconductor monolayers defining a base semiconductor portion and at least one nonsemiconductor monolayer thereon, and with the at least one non-semiconductor monolayer being constrained within a crystal lattice of adjacent base semiconductor portions;

selectively removing at least portions of the non-monocrystalline regions using at least one active area (AA) mask; and forming a plurality of NMOS and PMOS transistor channels associated with the superlattices and defining a CMOS device.

14. The method according to claim 13 wherein the at least one AA mask comprises a single baseline AA.

15. The method according to claim 13 wherein the at least one AA mask comprises a first oversized channel-stop AA mask for NMOS transistors and a second oversized channel-stop AA mask for PMOS transistors.

16. The method according to claim 15 further comprising performing a first channel-stop implant using the first oversized channel-stop AA mask, and performing a second channel-stop implant using the second oversized channel-stop AA mask.

17. The method according to claim 16 further comprising performing a first etch prior to the first channel-stop implant and performing a second etch prior to the second channel-stop implant.

18. The method according to claim 15 wherein non-monocrystalline stringers are formed in divots in the STI regions; and further comprising performing at least a partial etch of the non-monocrystalline stringers.

19. The method according to claim 13 wherein selectively removing comprises:

patterning a photoresist layer with the at least one AA mask to expose the non-monocrystalline regions; and performing at least one plasma etching of the exposed non-monocrystalline regions.

20. The method according to claim 13 wherein each base semiconductor portion comprises a base semiconductor selected from the group consisting of Group IV semiconductors, Group III-V semiconductors, and Group II-VI semiconductors; and wherein each non-semiconductor layer comprises a non-semiconductor selected from the group consisting of oxygen, nitrogen, fluorine, and carbon-oxygen.

* * * * *